(12) United States Patent
Morohashi et al.

(10) Patent No.: US 9,614,174 B2
(45) Date of Patent: Apr. 4, 2017

(54) ORGANIC ELECTROLUMINESCENT DEVICES

(71) Applicant: UDC Ireland Limited, Dublin (IE)

(72) Inventors: Kana Morohashi, Kanagawa (JP); Manabu Tobise, Kanagawa (JP); Shinichiro Sonoda, Kanagawa (JP); Jingbo Li, Kanagawa (JP); Yuichiro Sakai, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 0 days.

(21) Appl. No.: 13/932,585

(22) Filed: Jul. 1, 2013

(65) Prior Publication Data

US 2014/0008620 A1 Jan. 9, 2014

(30) Foreign Application Priority Data

Jul. 5, 2012 (JP) .................................. 2012-151167

(51) Int. Cl.
*H01L 51/52* (2006.01)
*H01L 51/00* (2006.01)

(52) U.S. Cl.
CPC ...... *H01L 51/5203* (2013.01); *H01L 51/5206* (2013.01); *H01L 51/5212* (2013.01); *H01L 51/5215* (2013.01); *H01L 51/5234* (2013.01); *H01L 51/5268* (2013.01); *H01L 51/5271* (2013.01); *H01L 51/0059* (2013.01); *H01L 51/0072* (2013.01); *H01L 51/0081* (2013.01); *H01L 51/0087* (2013.01); *H01L 2251/5369* (2013.01)

(58) Field of Classification Search
CPC .................................................. H01L 51/5203
See application file for complete search history.

(56) References Cited

U.S. PATENT DOCUMENTS

2004/0061136 A1* 4/2004 Tyan .................... H01L 51/5268
257/200
2006/0244371 A1* 11/2006 Cok ..................... H01L 51/5278
313/506

(Continued)

FOREIGN PATENT DOCUMENTS

JP 2004-127942 4/2004
JP 2004-296429 10/2004

(Continued)

*Primary Examiner* — Cuong Q Nguyen
*Assistant Examiner* — Nishath Yasmeen
(74) *Attorney, Agent, or Firm* — Riverside Law LLP

(57) ABSTRACT

[It is an object] to provide an organic electroluminescent element having a transparent electrode, with which there is no need to produce a separate light extraction layer, [which can be produced by] a simple film formation process, and which is advantageous in terms of cost. [This is] an organic electroluminescent element in which a substrate, a first transparent electrode that is adjacent to this substrate, an organic layer including at least one organic light-emitting layer, a second transparent electrode, a low refractive-index layer with a refractive index of 1.3 or less, and a reflector layer are formed in this order, with this organic electroluminescent element being such that the aforementioned first transparent electrode contains at least one type of transparent particle with a primary particle size of 0.5 μm or more.

7 Claims, 7 Drawing Sheets

(56) References Cited

U.S. PATENT DOCUMENTS

2007/0013293 A1* 1/2007 Cok .................. B82Y 20/00
                                                313/504
2007/0120108 A1* 5/2007 Asabe ............. H01L 51/5253
                                                 257/13

FOREIGN PATENT DOCUMENTS

| JP | 2004-303724 | 10/2004 |
| JP | 2004-333716 | 11/2004 |
| JP | 2006-032088 | 2/2006 |
| JP | 2008-515130 | 5/2008 |
| JP | 2012-009359 | 1/2012 |
| WO | 2012-081442 | 6/2012 |

* cited by examiner

FIG. 3 Multiplying factor with calculation model 2 when D/W = 0.5 in cases where the multiplying factor of the light extraction efficiency in calculation model 1 is 1
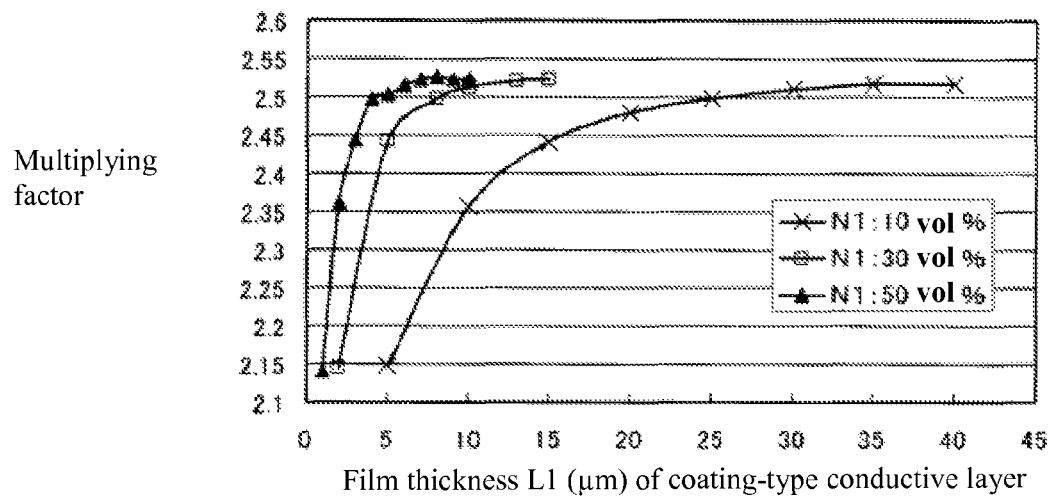
FIG. 4 Multiplying factor with each model in cases where the multiplying factor of the light extraction efficiency in calculation model 1 is 1
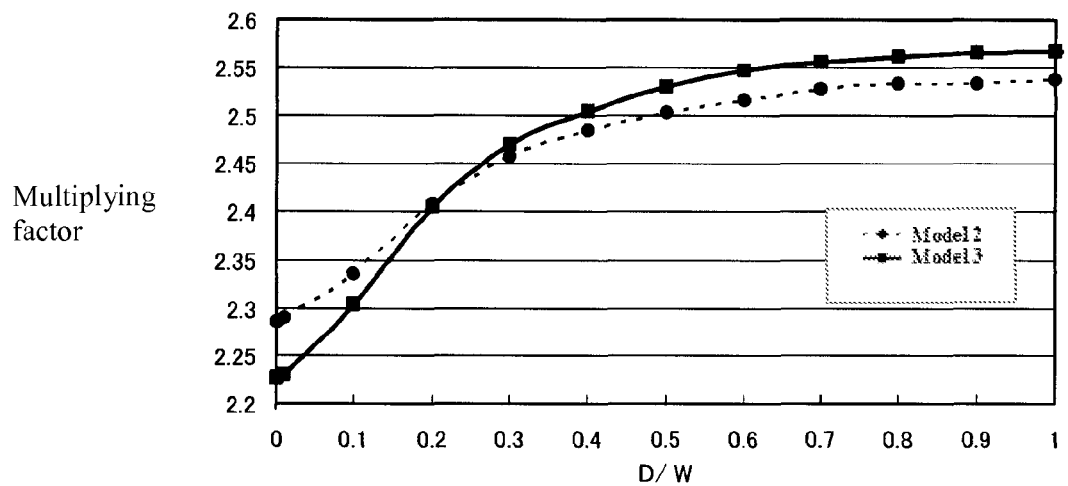

ORGANIC ELECTROLUMINESCENT DEVICES

CROSS-REFERENCE TO RELATED APPLICATIONS

The present U.S. patent application claims priority benefit from Japanese Patent Appl. No. 2012-151167, filed 05 Jul. 2012, which is incorporated by reference herein in its entirety.

TECHNICAL FIELD

The present invention relates to an organic electroluminescent element in which a substrate, a first transparent electrode that is adjacent to this substrate, an organic layer including at least one organic light-emitting layer, a second transparent electrode, a low refractive-index layer with a refractive index of 1.3 or less, and a reflector layer are formed in this order, with this organic electroluminescent element being such that the aforementioned first transparent electrode contains at least one type of transparent particle with a primary particle size of 0.5 µm or more.

BACKGROUND ART

An organic electroluminescent element is a self-emitting type of light-emitting device having a pair of electrodes composed of an anode and a cathode on a substrate and an organic layer that includes a light-emitting layer in between the pair of electrodes. [These elements] are expected to find use in a variety of applications such as displays and illumination lighting.

In order for the light generated by the light-emitting layer to be extracted, at least either the anode or the cathode of the organic electroluminescent element needs to be an electrode that has optical transparency, and indium tin oxide (ITO) is generally used as an electrode having optical transparency.

Aiming at improving the light extraction efficiency of a device, an organic light-emitting diode has been proposed which comprises a transparent substrate, a light-scattering layer, a transparent first electrode layer, an organic EL element, and a transparent second electrode layer. Furthermore, it has been proposed that a low refractive-index isolation layer be provided in order to reduce the absorptivity of a reflector layer that can be disposed on the second transparent electrode layer (Patent Document 1).

With the aim of accomplishing both extraction of light at a high efficiency and improvement of electrical characteristics, an organic electroluminescent element has been proposed which has an electrode in which a first transparent conductive layer composed of conductive nanoparticles and a binder and a second transparent conductive layer composed of a conductive polymer are formed in this order on a substrate surface (Patent Document 2).

RELATED ART DOCUMENTS

Patent Documents

Patent Document 1: Japanese Laid-Open Patent Application 2004-127942

Patent Document 2: Japanese Laid-Open Patent Application 2012-009359

SUMMARY OF THE INVENTION

Problems to be Solved by the Invention

However, Patent Document 1 suggests an inorganic compound or a polymer as the component used in the low refractive-index isolation layer, but there is no mention whatsoever of the critical effect of using a layer with a refractive index of 1.3 or less as the low refractive-index isolation layer. Moreover, the light-scattering layer constitutes a layer separate from the electrode, there is no mention whatsoever of a structure in which the electrode itself plays the role of a light-scattering layer, and no concrete disclosure is found of an organic light-emitting diode having a low refractive-index isolation layer, either. In addition, forming the light-scattering layer separately from the electrode adds another step of producing a layer, which can drive up the cost of manufacturing the element. Furthermore, there is a possibility that gas will be generated from the light-scattering layer itself, which poses the risk of damage to the element.

Meanwhile, the conductive nanoparticles used in Patent Document 2 have a small particle size, and there is no description regarding the addition of micron-order particles to an electrode. Moreover, an attempt to raise the light extraction efficiency was made by reducing the refractive index difference, but with this method alone, the increase in the light extraction efficiency is limited to approximately 1.1 to 1.3 times.

It is an object of the present invention to solve the aforementioned various problems encountered in the past and to achieve the following goals:

Namely, the present invention has as its object to provide an organic electroluminescent element having a transparent electrode, with which there is no need to produce a separate light extraction layer, [which can be produced by] a simple film formation process, and which is advantageous from a cost standpoint. It is also an object to provide an organic electroluminescent element in which the transparent electrode contains at least one type of transparent particle with a primary particle size of 0.5 µm or more, which is provided with a low refractive-index layer having a refractive index of 1.3 or less, and which is excellent from the standpoint of light extraction efficiency.

Means for Solving the Problems

The present inventors conducted diligent research aimed at solving the aforementioned problems and discovered an organic electroluminescent element in which a substrate, a first transparent electrode that is adjacent to this substrate, an organic layer including at least one organic light-emitting layer, a second transparent electrode, a low refractive-index layer with a refractive index of 1.3 or less, and a reflector layer are formed in this order, wherein the aforementioned first transparent electrode contains at least one type of transparent particle with a primary particle size of 0.5 µm or more. [The inventors] also discovered that light extraction efficiency could be greatly enhanced by employing an organic electroluminescent element having this constitution.

Specifically, the means for solving the aforementioned problems are as follows:

(1) An organic electroluminescent element in which a substrate, a first transparent electrode that is adjacent to the substrate, an organic layer including at least one organic light-emitting layer, a second transparent electrode, a low refractive-index layer with a refractive index of 1.3 or less, and a reflector layer are formed in this order, wherein the first transparent electrode contains at least one type of transparent particle with a primary particle size of 0.5 μm or more.

(2) The organic electroluminescent element according to (1), wherein the content rate N1 (vol %) of transparent particles with a primary particle size of 0.5 μm or more contained in the first transparent electrode and the film thickness L1 (μm) of the first transparent electrode satisfy the relationship $L1 \times N1 \geq 200$.

(3) The organic electroluminescent element according to (1) or (2), wherein, of the faces where the organic layer is in contact with the layers adjacent to the organic layer, if the surface area of the face closer to the reflector layer is designated as S (μm$^2$), and the thickness of the low refractive-index layer is designated as D (μm), then [the relationship] $D/S \geq 0.04$ is satisfied.

(4) The organic electroluminescent element according to any one of (1) to (3), wherein at least either the first transparent electrode or the second transparent electrode contains a conductive matrix.

(5) The organic electroluminescent element according to any one of (1) to (4), wherein the first transparent electrode further contains particles having a primary particle size of 100 nm or less.

(6) The organic electroluminescent element according to any one of (1) to (5), wherein the first transparent electrode contains a conductive matrix and particles having a primary particle size of 100 nm or less, and the refractive index of the particles is higher than the refractive index of the conductive matrix.

(7) The organic electroluminescent element according to any one of (1) to (6), wherein the reflector layer is made up of a metal or is made up of a diffusing reflector plate with a reflectance of at least 90%.

(8) The organic electroluminescent element according to any one of (1) to (7), wherein the first transparent electrode is composed of two layers: a first layer containing at least one type of transparent particle with a primary particle size of 0.5 μm or more and a second layer that does not contain transparent particles with a primary particle size of 0.5 μm or more but does contain particles with a primary particle size of 100 nm or less.

(9) The organic electroluminescent element according to (8), wherein the absolute value of the difference between the refractive index of the constituent components of the second layer constituting the first transparent electrode and the refractive index of what is left over after eliminating the transparent particles with a primary particle size of 0.5 μm or more from the constituent components of the first layer constituting the first transparent electrode is 0.02 or less.

(10) The organic electroluminescent element according to any one of (1) to (9), wherein the second transparent electrode contains at least one type of transparent particle with a primary particle size of 0.5 μm or more.

(11) The organic electroluminescent element according to (10), wherein the content rate N2 (vol %) of the transparent particles with a primary particle size of 0.5 μm or more contained in the second transparent electrode and the film thickness L2 (μm) of the second transparent electrode satisfy the relationship $L2 \times N2 \geq 200$.

Effects of the Invention

The present invention makes it possible to provide an organic electroluminescent element having a transparent electrode, with which there is no need to produce a separate light extraction layer, [which can be produced by] a simple film formation process, and which is advantageous from a cost standpoint. It is also possible to provide an organic electroluminescent element in which the transparent electrode contains at least one type of transparent particle with a primary particle size of 0.5 μm or more, which is provided with a low refractive-index layer having a refractive index of 1.3 or less, and which is excellent from the standpoint of light extraction efficiency.

In addition, a transparent electrode formed by a coating solution containing a conductive matrix such as PEDOT-PSS has poor transparency, and the transmittance of visible light tends to decrease. With the present invention, however, the decrease in transmittance can be suppressed by doping with diffusion-use transparent resin diffusing particles.

BRIEF DESCRIPTION OF THE DRAWINGS

FIG. 3 is a graph illustrating the relationship between the multiplying factor and film thickness of a coating-type conductive layer in calculation model 2.

FIG. 4 is a graph illustrating the relationship between the multiplying factor and D/W in calculation models 2 and 3.

DETAILED DESCRIPTION OF EMBODIMENTS

Figure 1:
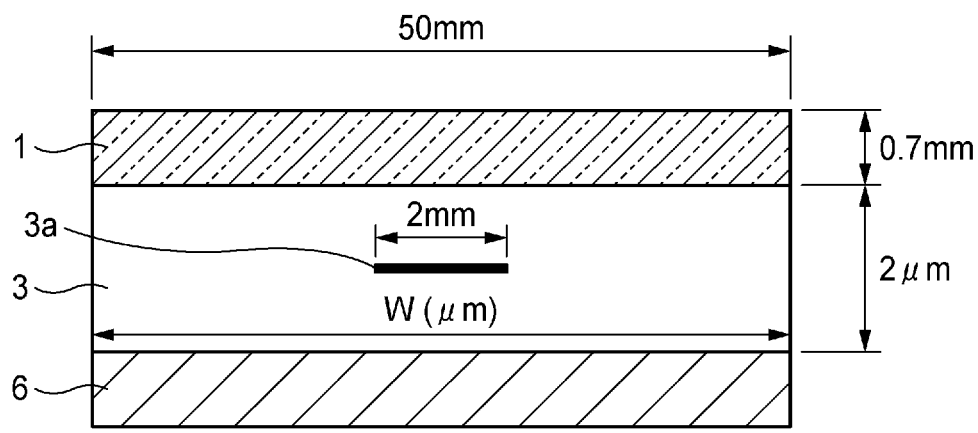
FIG. 1 is a schematic diagram illustrating the organic electroluminescent element in a calculation model 1.

The organic electroluminescent element of the present invention is an organic electroluminescent element in which a substrate, a first transparent electrode that is adjacent to this substrate, an organic layer including at least one organic light-emitting layer, a second transparent electrode, a low refractive-index layer with a refractive index of 1.3 or less, and a reflector layer are formed in this order, with the aforementioned first transparent electrode containing at least one type of transparent particle with a primary particle size of 0.5 μm or more.

First Transparent Electrode

The first transparent electrode of the present invention is an electrode that contains at least one type of transparent particle with a primary particle size of 0.5 μm or more (hereinafter also referred to as "light-diffusing particles").

There are no particular restrictions on the constituent components of the first transparent electrode of the present invention as long as it contains at least one type of light-diffusing particle, but it can be made up of light-diffusing particles and a conductive matrix, for example.

Here, the primary particle size of the light-scattering particles[1] in this Specification is a primary particle size [found by] dispersing 1 g of light-scattering particles in 200 g of methanol, measuring the size of the light-scattering particles using a "Multisizer II" precision particle size distribution measurement device made by Peckman Coulter [sic][2], and calculating so as to obtain an average particle size by volumetric standard.

[1] Translator's note: The terms "light-diffusing particles" and "light-scattering particles" seem to be used interchangeably in the original. The translation faithfully reflects the original wording.

[2] Translator's note: "Peckman Coulter" is an apparent typological error in the original for "Beckman Coulter."

Furthermore, [the term] "transparent electrode" means that the transmittance of a wavelength of 500 nm at a film thickness of 100 nm is at least 70%. Transmittance is measured using a U-3310 spectrophotometer made by Hitachi High-Technologies Corporation.

From the standpoint of a balance between optical transparency and resistance, the film thickness of the first transparent electrode is preferably at least 100 nm and no more than 5 μm, more preferably at least 200 nm and no more than 3 μm, and even more preferably at least 300 nm and no more than 2 μm.

The average thickness of the first transparent electrode can be found, for example, by slicing off a portion of the first transparent electrode and measuring it with a scanning electron microscope (S-3400N made by Hitachi High-Technologies Corporation).

[Light-Diffusing Particles]

There are no particular restrictions on the light-diffusing particles as long as they are transparent particles with a primary particle size of 0.5 μm or more and are able to scatter or diffuse light. [These particles] can be suitably selected according to the intended use and may be either organic particles or inorganic particles, and two or more types of particle may also be contained.

Here, [the term] "transparent particles" in this Specification means that the absorbance ($A(\lambda)$) is no more than 1, which is found using the following relational expression from the amount of incident light ($I_0$) and the total value of the amount of transmitted light ($I_T$) including the transmitted and scattered component and the amount of reflected light ($I_R$) including the scattered and reflected component, in the visible light region, and particularly within the range of wavelengths of 450 to 750 nm.

$$A(\lambda) = -\log_{10}\{(I_T + I_R)/I_0\}$$

Examples of the aforementioned organic particles include polymethyl methacrylate particles, crosslinked polymethyl methacrylate particles, acrylic-styrene copolymer particles, melamine particles, polycarbonate particles, polystyrene particles, crosslinked polystyrene particles, polyvinyl chloride particles, benzoguanamine-melamine formaldehyde particles, and other such resin particles.

Examples of the aforementioned inorganic particles include $ZrO_2$, $TiO_2$, $Al_2O_3$, $In_2O_3$, $ZnO$, $SnO_2$, and $Sb_2O_3$. Of these, $TiO_2$, $ZrO_2$, $ZnO$, and $SnO_2$ are particularly favorable.

Of these, resin particles in a crosslinked state are preferable as the aforementioned light-diffusing particles in terms of solvent resistance and dispersibility in a binder, and crosslinked polymethyl methacrylate particles are particularly preferable.

It can be confirmed that the aforementioned light-diffusing particles are resin particles in a crosslinked state by dispersing them in a solvent such as toluene and checking to see how difficult it is for them to dissolve.

There are no particular restrictions on the refractive index of the light-diffusing particles, which can be suitably selected as dictated by the intended use, but it is preferably at least 1.0 and no more than 3.0, more preferably at least 1.2 and no more than 2.0, and even more preferably at least 1.3 and no more than 1.7. If the refractive index is at least 1.0 and no more than 3.0, the light diffusion (scattering) will not be excessive, so the light extraction efficiency will tend to be better.

The refractive index of the light-scattering particles in this Specification is a refractive index obtained by forming a material serving as the raw material of the aforementioned light-scattering particles into a film on a silicon substrate to a thickness approximately corresponding to the wavelength of the light source of an ellipsometer used for measuring a refractive index and measuring the aforementioned film with this ellipsometer. The refractive index of the particles with a primary particle size of no more than 100 nm (described later) is also a refractive index measured in the same way.

The primary particle size of the light-diffusing particles is preferably at least 0.5 μm and no more than 10 μm, more preferably at least 0.5 μm and no more than 6 μm, and even more preferably at least 1 μm and no more than 3 μm. If the primary particle size of the aforementioned light-diffusing particles is no more than 10 μm, light will tend not to scatter forward, so there will tend not to be a decrease in the ability of the light-diffusing particles of converting the angle of the light.

On the other hand, if the primary particle size of the aforementioned light-diffusing particles is less than 0.5 μm, [the size] will be smaller than the wavelength of visible light, and Mie scattering will change to the realm of Rayleigh scattering. Consequently, the wavelength dependence of the scattering efficiency of the light-diffusing particles increases, and the chromaticity of the organic electroluminescent element tends to vary, which is undesirable. This is also unfavorable in that rearward scattering will become excessive, and light extraction efficiency will decrease.

The amount in which the light-diffusing particles are contained in the first transparent electrode is preferably at least 30 vol % and no more than 66 vol %, more preferably at least 40 vol % and no more than 60 vol %, and particularly preferably at least 45 vol % and no more than 55 vol %. If the aforementioned amount is at least 30 vol %, there will be a high probability that light incident on the first transparent electrode will be scattered by the light-diffusing particles, and the ability to convert the optical angle of the first transparent electrode will be good, so the light extraction efficiency will increase even without increasing the thickness of the first transparent electrode. Moreover, because the thickness of the aforementioned first transparent electrode needs not be increased, this leads to a reduction in cost, there is less variance in the thickness of the first transparent electrode, and variance will tend not to occur in the scattering effect within the light-emitting face. Meanwhile, if the aforementioned amount is no more than 66 vol %, the surface of the aforementioned first transparent electrode will not be overly bumpy, and there will tend to be fewer voids in the interior, so the physical strength of the aforementioned first transparent electrode will tend not to decrease.

In addition, it is preferable if the content rate N1 (vol %) of the light-diffusing particles contained in the aforementioned first transparent electrode and the film thickness L1 (μm) of the aforementioned first transparent electrode satisfy the relationship $L1 \times N1 \geq 200$.

$L1 \times N1$ is preferably at least 200 and no more than 800, more preferably at least 220 and no more than 700, and even more preferably at least 250 and no more than 500.

If $L1 \times N1$ is at least 200, there will be a higher probability that light passing through the first transparent electrode will strike the light-diffusing particles, and the forward scattering of the light will proceed sufficiently in the first transparent electrode. It is preferable for there to be adequate forward scattering of the light because more of the light will be radiated to the interface with the substrate, and the light extraction efficiency will increase.

From the standpoint of light extraction efficiency, the first transparent electrode preferably contains the aforementioned resin particles and titanium oxide microparticles that have undergone a photocatalyst inactivation treatment. Concrete examples and favorable ranges of these titanium oxide microparticles that have undergone a photocatalyst inactivation treatment are the same as those given above for the first transparent electrode.

[Particles Whose Primary Particle Size is 100 nm or Less]

With the present invention, the aforementioned first transparent electrode can further contain particles whose primary particle size is 100 nm or less (hereinafter also referred to as "nano-sized particles").

(Nano-Sized Particles Having a Refractive Index Greater than the Conductive Matrix)

The aforementioned nano-sized particles preferably have a refractive index that is higher (greater) than the refractive index of the conductive matrix (described later). Adding nano-sized particles with a high refractive index to the conductive matrix makes it possible to adjust the refractive index of the transparent electrode to be higher than the refractive index which the conductive matrix naturally has.

The nano-sized particles having a refractive index greater than that of the conductive matrix are preferably inorganic microparticles and are [more] preferably metal oxide microparticles such as microparticles of an oxide of aluminum, titanium, zirconium, or antimony. From the standpoint of refractive index, microparticles of titanium oxide are particularly preferable. Titanium oxide microparticles are preferably those for which the photocatalyst effect has undergone an inactivation treatment.

—Titanium Oxide Microparticles that have Undergone Photocatalyst Inactivation Treatment—

There are no particular restrictions on the titanium oxide microparticles that have undergone photocatalyst inactivation treatment as long as they do not have photocatalytic activity, and they can be suitably selected as dictated by the intended use, but examples include (1) titanium oxide microparticles the surface of which has been covered with at least one of alumina, silica, and zirconia and (2) titanium oxide microparticles in which the covered surface of the covered titanium oxide microparticles of (1) above has been covered with a resin. Examples of the aforementioned resin include polymethyl methacrylate (PMMA).

It is possible to confirm that the aforementioned titanium oxide microparticles which have undergone a photocatalyst inactivation treatment do not have photocatalytic activity by means of the methylene blue method, for example.

There are no particular restrictions on the titanium oxide microparticles in the aforementioned titanium oxide microparticles that have undergone a photocatalyst inactivation treatment, which can be suitably selected as dictated by the intended use, but the aforementioned crystal structure is preferably one in which the main component is rutile, a mixed crystal of rutile and anatase, or anatase, and a rutile structure is particularly favorable as the main component.

The aforementioned titanium oxide microparticles may be compounded by adding a metal oxide other than titanium oxide.

The metal oxide that can be compounded with the aforementioned titanium oxide microparticles is preferably at least one type of metal oxide selected from among Sn, Zr, Si, Zn, and Al.

The amount in which the aforementioned metal oxide is added with respect to the titanium is preferably 1 to 40 mol %, more preferably 2 to 35 mol %, and even more preferably 3 to 30 mol %.

The average particle size (primary particle size) of the nano-sized particles having a refractive index greater than that of the conductive matrix is preferably at least 1 nm and no more than 100 nm, more preferably at least 1 nm and no more than 30 nm, particularly preferably at least 1 nm and no more than 25 nm, and most preferably at least 1 nm and no more than 20 nm. It is preferable for the primary particle size to be no more than 100 nm because the dispersion will tend not to be cloudy, and settling will tend not to occur, and it is preferable for it to be at least 1 nm because the crystal structure will be well defined and not amorphous, and there will be fewer changes such as gelling over time.

The aforementioned primary particle size can be measured, for example, by calculation from the half-value width of the diffraction pattern measured with an X-ray diffraction device, by statistical calculation from the diameter of an image captured with an electron microscope (TEM), and the like.

There are no particular restrictions on the shape of the nano-sized particles having a refractive index greater than that of the conductive matrix, which can be suitably selected as dictated by the intended use, but favorable examples include a shape like a grain of rice, spherical, cuboid, spindle shaped, and irregular. For the aforementioned titanium oxide microparticles, just one type may be used alone, or two or more types may be used together.

In order to raise the refractive index of the first transparent electrode, the nano-sized particles having a refractive index greater than that of the conductive matrix preferably have a refractive index of at least 2.0 and no more than 3.0, more preferably at least 2.2 and no more than 3.0, even more preferably at least 2.2 and no more than 2.8, and particularly preferably at least 2.2 and no more than 2.6. It is preferable for the aforementioned refractive index to be at least 2.0 because the refractive index of the first transparent electrode can be effectively raised, and for the aforementioned refractive index to be no more than 3.0 because there will be no problems such as discoloration of the particles.

The refractive index of the nano-sized particles having a refractive index greater than that of the conductive matrix can be measured as follows: A resin material with a known refractive index is doped with particles having a refractive index greater than that of the conductive matrix, and the resin material in which these particles have been dispersed

[is used to] form a coating film over a silicon substrate or quartz substrate. The refractive index of the aforementioned coating film is measured with an ellipsometer, and the refractive index of the aforementioned particles is found from the volume fraction of the resin material and the aforementioned particles that make up the aforementioned coating film.

Because of the necessity of raising the refractive index of the aforementioned first transparent electrode over the refractive index of the organic layers (and particularly the light-emitting layer), the nano-sized particles having a refractive index greater than that of the conductive matrix are preferably contained in the first transparent electrode in an amount of at least 10 vol % and no more than 50 vol %, more preferably at least 15 vol % and no more than 50 vol %, and even more preferably at least 20 vol % and no more than 50 vol %, with respect to the total volume of the first transparent electrode. It is preferable for the aforementioned contained amount to be at least 10 vol % because the refractive index of the first transparent electrode can be raised effectively, and the light extraction efficiency is enhanced, and it is preferable for it to be no more than 50 vol % because the Rayleigh scattering will not be excessive, and the light extraction efficiency is enhanced.

With the present invention, from the standpoint of increasing the light extraction efficiency, the refractive index of the first transparent electrode is preferably at least as high as the refractive index of the organic light-emitting layer of the organic electroluminescent element, and at least as high as the refractive index of the light-emitting layer and other such organic layers of the organic electroluminescent element. In concrete terms, it is preferably at least 1.7 and no more than 2.2, more preferably at least 1.7 and no more than 2.1, and even more preferably at least 1.7 and no more than 2.0.

The resistance of the first transparent electrode is preferably at least 1 Ω/sq. and no more than 1000 Ω/sq., more preferably at least 1 Ω/sq. and no more than 500 Ω/sq., and even more preferably at least 1 Ω/sq. and no more than 300 Ω/sq.

The optical transmittance of the first transparent electrode is preferably at least 70% and no more than 99%, more preferably at least 75% and no more than 99%, and even more preferably at least 80% and no more than 99%.

[Conductive Matrix]

The first transparent electrode of the present invention preferably contains a conductive matrix. The conductive matrix is preferably a conductive polymer.

A π-conjugated conductive polymer or a σ-conjugated conductive polymer is preferable as the conductive polymer, with a π-conjugated conductive polymer being more preferable.

Examples of σ-conjugated conductive polymers include poly(methylphenylsilane), poly(methylpropylsilane), poly (phenyl-p-biphenylsilane), and poly(dihexylsilane).

(π-Conjugated Conductive Polymer)

There are no particular restrictions on the π-conjugated conductive polymer as long as it is an organic polymer in which the main chain is made up of a π-conjugated system. For reasons of compound stability and high conductivity, the π-conjugated conductive polymer is preferably a π-conjugated heterocyclic compound or a derivative of a π-conjugated heterocyclic compound.

Examples of π-conjugated conductive polymers include at least one type selected from the group consisting of aliphatic conjugated polyacetylene, polyacene, and polyazulene, aromatic conjugated polyphenylene, heterocyclic conjugated polypyrrole, polythiophene, polyisothianaphtene, hetero atom-containing conjugated polyaniline, polythienylenevinylene, mixed conjugated poly(phenylenevinylene), multiple-chain conjugation systems which are conjugation systems having a plurality of conjugation chains in the molecule, derivatives of these conductive polymers, and conductive compounds that are polymers in which these conjugated polymer chains are grafted or block copolymerized to a saturated polymer.

In terms of stability in air, a polypyrrole, a polythiophene, a polyaniline, or a derivative of these is preferable, with polythiophenes, polyanilines, and derivatives of these (namely, polythiophenes, polyanilines, polythiophene derivatives, and polyaniline derivatives) being more preferable.

Even unsubstituted, it is possible for the π-conjugated conductive polymer to obtain sufficient conductivity and compatibility in the binder resin, but it is preferable to introduce an alkyl group, carboxy group, sulfo group, alkoxy group, hydroxy group, or other such functional group into the π-conjugated conductive polymer in order to further enhance conductivity and compatibility.

Concrete examples of π-conjugated conductive polymers include polypyrroles: polypyrrole, poly(N-methylpyrrole), poly (3-methylpyrrole), poly(3-ethylpyrrole), poly(3-n-propylpyrrole), poly(3-butylpyrrole), poly(3-octylpyrrole), poly (3-decylpyrrole), poly(3-dodecylpyrrole), poly(3,4-dimethylpyrrole), poly(3,4-dibutylpyrrole), poly(3-carboxypyrrole), poly(3-methyl-4-carboxypyrrole), poly(3-methyl-4-carboxyethylpyrrole), poly(3-methyl-4-carboxybutylpyrrole), poly(3-hydroxypyrrole), poly(3-methoxypyrrole), poly(3-ethoxypyrrole), poly(3-butoxypyrrole), and poly(3-methyl-4-hexyloxypyrrole);

polythiophenes: polythiophene, poly(3-methylthiophene), poly(3-ethylthiophene), poly(3-propylthiophene), poly(3-butylthiophene), poly(3-hexylthiophene), poly(3-heptylthiophene), poly(3-octylthiophene), poly(3-decylthiophene), poly(3-dodecylthiophene), poly(3-octadecylthiophene), poly(3-bromothiophene), poly(3-chlorothiophene), poly(3-iodothiophene), poly(3-cyanothiophene), poly(3-phenylthiophene), poly(3,4-dimethylthiophene), poly(3,4-dibutylthiophene), poly(3-hydroxythiophene), poly(3-methoxythiophene), poly(3-ethoxythiophene), poly(3-butoxythiophene), poly(3-hexyloxythiophene), poly(3-heptyloxythiophene), poly(3-octyloxythiophene), poly(3-decyloxythiophene), poly(3-dodecyloxythiophene), poly(3-octadecyloxythiophene), poly(3-methyl-4-methoxythiophene), poly(3,4-ethylenedioxythiophene), poly(3-methyl-4-ethoxythiophene), poly(3-carboxythiophene), poly(3-methyl-4-carboxythiophene), poly(3-methyl-4-carboxyethylthiophene), and poly(3-methyl-4-carboxybutylthiophene); and polyanilines: polyaniline, poly(2-methylaniline), poly(3-isobutylaniline), poly(2-anilinesulfonic acid), and poly(3-anilinesulfonic acid).

(Polymer Dopant Having Anion Group)

The π-conjugated conductive polymer is preferably used along with a polymer dopant having an anion group (also referred to as a "polyanion dopant"). Specifically, in this case, the result is an organic conductive polymer composition containing an organic conductive polymer compound (π-conjugated conductive polymer) and a polymer dopant having an anion group. Using a combination of a π-conjugated conductive polymer with a polymer dopant having an anion group increases conductivity, improves the stability of conductivity over time, and increases water resistance in a laminate state.

Examples of polyanion dopants include polymers which have a structure of at least one of substituted or unsubstituted polyalkylenes, substituted or unsubstituted polyalkenylenes, substituted or unsubstituted polyimides, substituted or unsubstituted polyamides, and substituted or unsubstituted polyesters, and which include structural units having an anion group.

Examples of the anion group of the polyanion dopant include —O—$SO_3^-X^+$, —$SO_3^-X^+$, and —$COO^-X^+$ (in each formula, $X^+$ represents a hydrogen ion or an alkali metal ion).

Of these, —$SO_3^-X^+$ and —$COO^-X^+$ are preferable in terms of doping capability to the organic conductive polymer compound.

Of the aforementioned polyanion dopants, in terms of solvent solubility and conductivity, it is preferable [to use] polyisoprene sulfonic acid, a copolymer containing polyisoprene sulfonic acid, polysulfoethyl methacrylate, a copolymer containing a polysulfoethyl methacrylate, poly(4-sulfobutyl methacrylate), a copolymer containing a poly(4-sulfobutyl methacrylate), polymethallyloxybenzene sulfonic acid, a copolymer containing a polymethallyloxybenzene sulfonic acid, polystyrene sulfonic acid, a copolymer containing a polystyrene sulfonic acid, or the like.

The degree of polymerization of the polyanion dopant is preferably in a range of 10 to 100,000 monomer units, and in terms of solvent solubility and conductivity, more preferably in a range of 50 to 10,000 [monomer units].

The contained amount of the polyanion dopant is preferably in a range of 0.1 to 10 mol and more preferably in a range of 1 to 7 mol per mole of organic conductive polymer compound. The molar number here is defined by the number of structural units originating in the pyrrole, thiophene, aniline, or other monomer that forms the organic conductive polymer compound, and the number of structural units originating in the monomer that includes an anion group and forms the polyanion dopant. If the contained amount of the polyanion dopant is at least 0.1 mol per mole of organic conductive polymer compound, the doping effect on the organic conductive polymer compound will be greater, and there will be sufficient conductivity. Furthermore, solubility and dispersibility in a solvent will be enhanced, and uniform dispersion can be obtained easily. If the contained amount of the polyanion dopant is no more than 10 mol per mole of organic conductive polymer compound, more of the organic conductive polymer compound can be contained, so sufficient conductivity can be obtained more easily.

(Solubility in Water or Organic Solvents)

From the standpoint of coatability, the conductive polymer is preferably soluble in water or an organic solvent. More concretely, the conductive polymer is preferably soluble by at least 1.0 wt % in water or in an organic solvent having a dielectric constant of 2 to 30 and a water content of 5 wt % or less. [The term] "soluble" here refers to either that single molecules or groups of a plurality of single molecules are dissolved, or that [the polymer] is dispersed in the form of particles with a particle size of 300 nm or less.

Organic conductive polymers are generally very hydrophilic and dissolve in water or solvents whose main component is water, but an example of a method for solubilizing such an organic conductive polymer in an organic solvent is to add a compound that raises affinity with organic solvents, an organic solvent dispersant, or the like to the composition containing the organic conductive polymer. Moreover, if an organic conductive polymer and a polyanion dopant are used, it is preferable to subject the polyanion dopant to a hydrophobic treatment.

Alcohols, aromatic hydrocarbons, ethers, ketones, esters, and so forth are favorable, for example, as organic solvents.

A conductive layer can be produced, for example, by applying the aforementioned various types of material to the surface of a transparent substrate by a publicly known thin-film formation method, such as dip coating, air knife coating, curtain coating, roller coating, wire bar coating, gravure coating, microgravure coating, and extrusion coating, then drying [the film], and irradiating it with light and/or heat. Preferably, curing by optical irradiation is advantageous in terms of quick curing. In addition, it is also preferable to follow the photocuring treatment with a heat treatment after stopping the curing (polymerization reaction) of the diffusion layer by photopolymerization initiator. The heating temperature in this case is preferably 60 to 105° C., more preferably 70 to 100° C., and even more preferably 70 to 90° C.

Any light source may be used for the optical irradiation as long as it is near the wavelength (absorption wavelength) at which the photopolymerization initiator reacts, and if the absorption wavelength is in the ultraviolet band, examples of light sources include a variety of mercury lamps of the extra-high pressure, high pressure, medium pressure, and low pressure type, chemical lamps, carbon arc lamps, metal halide lamps, xenon lamps, and sunlight. It is also possible to irradiate with a multi-beam light source of various kinds of laser that are available in wavelengths of 350 to 420 nm. Furthermore, if the absorption wavelength is in the infrared band, examples of light sources include halogen lamps, xenon lamps, and high-pressure sodium lamps, and it is also possible to irradiate with a multi-beam light source of various kinds of laser that are available in wavelengths of 750 to 1,400 nm.

In the case of photo-radical polymerization by optical irradiation, this can be carried out in air or an inert gas, but in order to shorten the induction period of the polymerization of a radical polymerizable monomer, to raise the polymerization rate thoroughly, or the like, it is preferable to make the atmosphere such that the concentration of oxygen is as small as possible. The aforementioned oxygen concentration range is preferably 0 to 1,000 ppm, more preferably 0 to 800 ppm, and even more preferably 0 to 600 ppm. The intensity of the irradiation with UV rays is preferably 0.1 to 100 mW/cm$^2$, and the amount of optical irradiation on the coating film surface is preferably 100 to 10,000 mJ/cm$^2$, more preferably 100 to 5,000 mJ/cm$^2$, and particularly preferably 100 to 1,000 mJ/cm$^2$. If the aforementioned amount of optical irradiation is less than 100 mJ/cm$^2$, the conductive layer will not cure sufficiently and may dissolve when another layer is applied over the conductive layer or may fall apart during substrate washing. On the other hand, if the aforementioned amount of optical irradiation is over 10,000 mJ/cm$^2$, the polymerization of the conductive layer will proceed too far, which may cause the surface to yellow, decrease the transmittance, and lower the light extraction efficiency. Moreover, the temperature in the optical irradiation step is preferably 15 to 70° C., more preferably 20 to 60° C., and particularly preferably 25 to 50° C. If the aforementioned temperature is lower than 15° C., the curing of the conductive layer by photopolymerization may take a long time, and if [the temperature] exceeds 70° C., it may affect the photopolymerization initiator itself, making photopolymerization (curing) impossible in some cases.

Substrate

A transparent substrate is preferable as the substrate in the organic electroluminescent element of the present invention.

There are no particular restrictions on the shape, structure, size, material, and so forth of the aforementioned transparent substrate, which can be suitably selected as dictated by the intended use, and an example of the aforementioned shape is a flat plate shape, the aforementioned structure may be a single-layer structure or a laminated structure, and the aforementioned size can be suitably selected.

There are no particular restrictions on the material of the aforementioned substrate, which can be suitably selected as dictated by the intended use, and examples include yttria-stabilized zirconia (YSZ), glass (non-alkaline glass, soda lime glass, etc.), and other such inorganic materials, polyethylene terephthalate (PET), polyethylene naphthalate (PEN), and other such polyester resins, polycarbonate, polyimide resin (PI), polyethylene, polyvinyl chloride, polyvinylidene chloride, polystyrene, and styrene-acrylonitrile copolymers. These may be used singly or in combinations of two or more types. Of these, a polyester resin is preferable, and from the standpoint of ease of coating with a roll, polyethylene terephthalate (PET) and polyethylene naphthalate (PEN) are particularly favorable.

The surface of the aforementioned substrate is preferably subjected to a surface activation treatment in order to improve adhesion to the first transparent electrode that is provided over this surface. Examples of the aforementioned surface activation treatment include glow discharge treatment, corona discharge treatment, and silane coupling treatment of a glass substrate.

The aforementioned substrate may be suitably synthesized, or a commercially available product may be used.

There are no particular restrictions on the thickness of the aforementioned substrate, which can be suitably selected as dictated by the intended use; at least 10 μm is preferable, and at least 50 μm is more preferable.

The refractive index of the aforementioned substrate is preferably at least 1.3 and no more than 1.8, more preferably at least 1.4 and no more than 1.7, and even more preferably at least 1.4 and no more than 1.6. If the refractive index of the aforementioned substrate is at least 1.3, the refractive index differential between the substrate and the first transparent electrode will not be too large, and when light from the first transparent electrode is incident, Fresnel reflection will not be excessive, so the light extraction efficiency will tend to be better. If the refractive index of the aforementioned substrate is no more than 1.8, the refractive index differential between the substrate and the air (on the light emission side) will not be too large, and the Fresnel reflection will not be excessive, so the light extraction efficiency will tend to be better.

Organic Layer

The organic layer in the organic electroluminescent element of the present invention has at least an organic light-emitting layer. Examples of functional layers other than the aforementioned organic light-emitting layer include a hole transport layer, an electron transport layer, a hole blocking layer, an electron blocking layer, a hole injection layer, an electron injection layer, and various other such layers.

The aforementioned organic layer preferably has a hole transport layer between the anode and the organic light-emitting layer, and preferably has an electron transport layer between the cathode and the light-emitting layer. In addition, a hole injection layer may be provided between the hole transport layer and the anode, and an electron injection layer may be provided between the electron transport layer and the cathode.

Furthermore, a hole transporting intermediate layer (electron blocking layer) may be provided between the aforementioned organic light-emitting layer and the hole transport layer, and an electron transporting intermediate layer (hole blocking layer) may be provided between the light-emitting layer and the electron transport layer. The various functional layers may be divided up into a plurality of secondary layers.

These functional layers including the aforementioned organic light-emitting layer can be favorably formed by vapor deposition, sputtering, or another such dry film formation method, a wet coating method, a transfer method, a printing method, an inkjet method, or the like.

—Organic Light-Emitting Layer—

When an electric field is applied, the aforementioned organic light-emitting layer accepts holes from the anode, the hole injection layer, or the hole transport layer, accepts electrons from the cathode, the electron injection layer, or the electron transport layer, and has the function of emitting light by providing a site for the rebonding of holes and electrons.

The aforementioned organic light-emitting layer includes a light-emitting material. The aforementioned organic light-emitting layer may be made up of a light-emitting material alone, or it may be a mixed layer of a host material and a light-emitting material (in the case of the latter, the light-emitting material will sometimes be called a "light-emitting dopant" or "dopant"). The aforementioned light-emitting material may be a fluorescent light-emitting material or a phosphorescent light-emitting material, and two or more types may be mixed. The host material is preferably a charge transport material. The host material may be a single type or two or more types. Moreover, the organic light-emitting layer may contain a material that does not have charge transport properties and does not emit light.

There are no particular restrictions on the thickness of the aforementioned organic light-emitting layer, which can be suitably selected as dictated by the intended use, but 2 to 500 nm is preferable, and from the standpoint of external quantum efficiency, 3 to 200 nm is more preferable, and 5 to 100 nm is even more preferable. In addition, the aforementioned organic light-emitting layer may be a single layer or may be two or more layers, and each of the layers may emit light of a different color.

——Light-Emitting Material——

Fluorescent light-emitting materials, phosphorescent light-emitting materials, and the like can all be used favorably as the aforementioned light-emitting material.

For the aforementioned light-emitting material, a dopant in which the difference in ionization potential ($\Delta Ip$) and the difference in electron affinity ($\Delta Ea$) between [this light-emitting material] and the host compound satisfy the relationships 1.2 eV>$\Delta Ip$>0.2 eV and/or 1.2 eV>$\Delta Ea$>0.2 eV is preferable from the standpoint of drive durability.

The light-emitting material in the aforementioned light-emitting layer is generally contained in the aforementioned light-emitting layer in an amount of 0.1 to 50 wt % with respect to the total compound weight forming the light-emitting layer, but it is preferable from the standpoints of durability and external quantum efficiency if [this material] is contained in an amount of 1 to 50 wt % and more preferably contained in an amount of 2 to 50 wt %.

———Phosphorescent Light-Emitting Materials———

A typical example of the aforementioned phosphorescent material is complexes containing transition metal atoms or lanthanoid atoms.

There are no particular restrictions on the aforementioned transition metal atom, which can be suitably selected as dictated by the intended use, and examples include ruthenium, rhodium, palladium, tungsten, rhenium, osmium, iridium, gold, silver, copper, and platinum. More preferable are rhenium, iridium, and platinum, with iridium and platinum being even more preferable.

Examples of ligands of the aforementioned complex include those discussed in "Comprehensive Coordination Chemistry," by G. Wilkinson et al., Pergamon Press, 1987, "Photochemistry and Photophysics of Coordination Compounds," by H. Yersin, Springer-Verlag, 1987, "Yuuki Kinzoku Kagaku—Kiso to Ouyou [Organometallic Chemistry—Fundamentals and Applications]," by A. Yamamoto, Tokabo, 1982, and elsewhere.

The aforementioned complex may have just one transition metal atom in the compound, or may be a so-called dinuclear complex having two or more [such atoms]. Different kinds of metal atoms may also be contained at the same time.

Of these, examples of phosphorescent light-emitting materials include the phosphorescent light-emitting compounds or the like described in publications of U.S. Pat. No. 6,303,238B1, U.S. Pat. No. 6,097,147, WO 00/57676, WO 00/70655, WO 01/08230, WO 01/39234A2, WO 01/41512A1, WO 02/02714A2, WO 02/15645A1, WO 02/44189A1, WO 05/19373A2, WO 2004/108857A1, WO 2005/042444A2, WO 2005/042550A1, Japanese Laid-Open Patent Applications 2001-247859, 2002-302671, 2002-117978, 2003-133074, 2002-235076, 2003-123982, and 2002-170684, EP 1211257, Japanese Laid-Open Patent Applications 2002-226495, 2002-234894, 2001-247859, 2001-298470, 2002-173674, 2002-203678, 2002-203679, 2004-357791, 2006-93542, 2006-261623, 2006-256999, 2007-19462, 2007-84635, and 2007-96259. Of these, Ir complexes, Pt complexes, Cu complexes, Re complexes, W complexes, Rh complexes, Ru complexes, Pd complexes, Os complexes, Eu complexes, Tb complexes, Gd complexes, Dy complexes, and Ce complexes are preferable, with Ir complexes, Pt complexes, and Re complexes being more preferable. Ir complexes, Pt complexes, and Re complexes [each] containing at least one coordination mode of metal-carbon bonds, metal-nitrogen bonds, metal-oxygen bonds, and metal-sulfur bonds are even more preferable, and from the standpoints of luminous efficiency, drive durability, chromaticity, and so forth, Ir complexes, Pt complexes, and Re complexes [each] containing a tridentate or higher polydentate ligand are particularly favorable.

The following compounds can be listed as concrete examples of the aforementioned phosphorescent light-emitting material, but [the phosphorescent material] is not limited to these:

[First Chemical Formula]

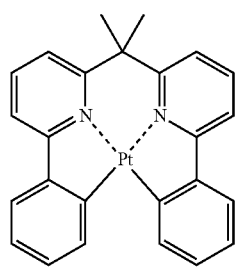

D-1

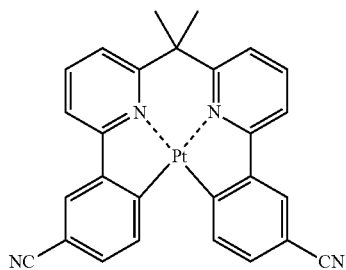

D-2

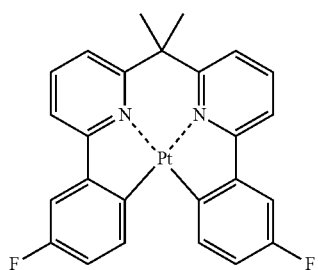

D-3

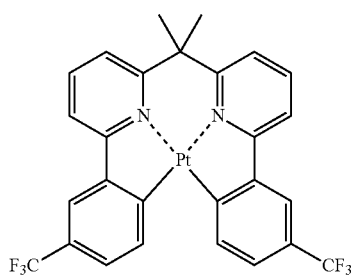

D-4

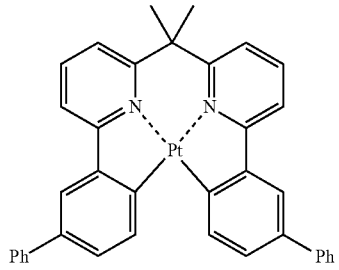

D-5

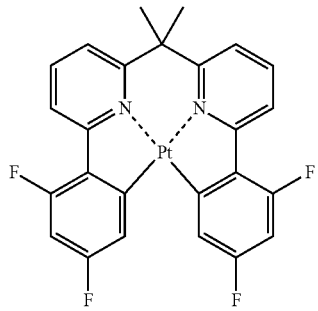

D-6

-continued
D-7
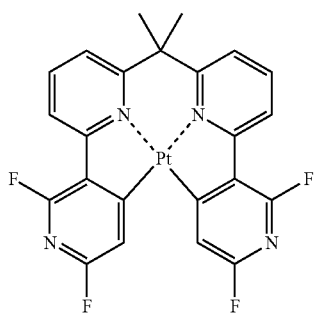
D-8
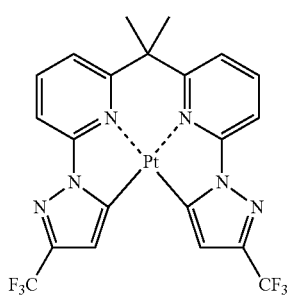
D-9
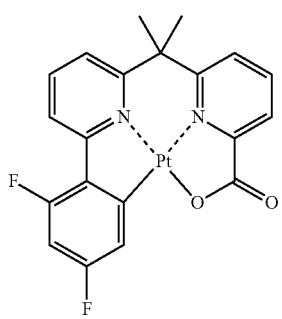
D-10
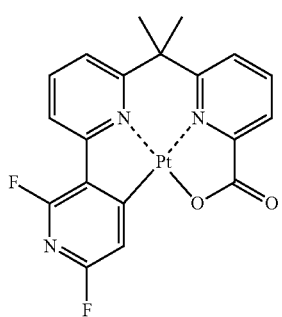
D-11
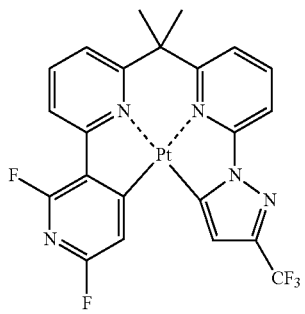
D-12
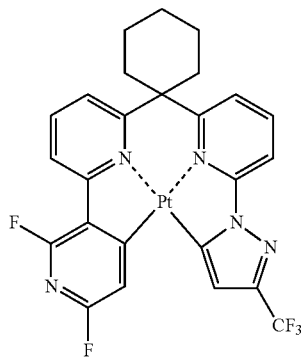
D-13
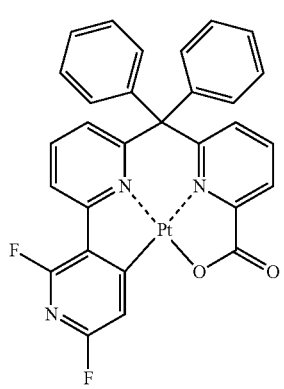
D-14
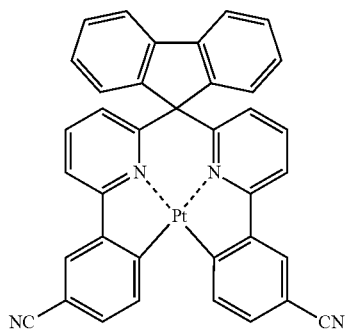
D-15
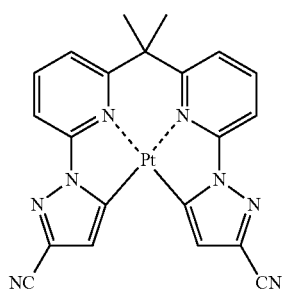

-continued
D-16
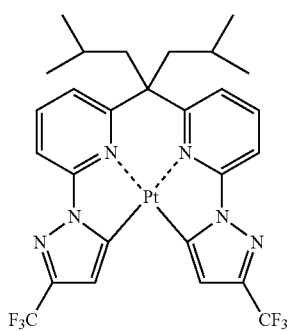
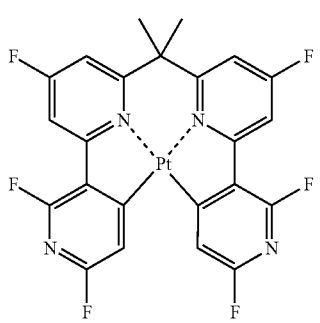
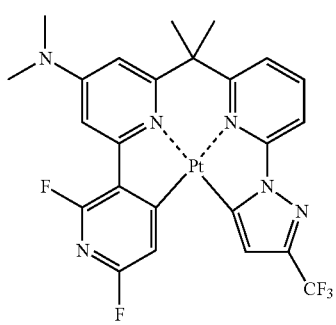
[Second Chemical Formula]
D-19
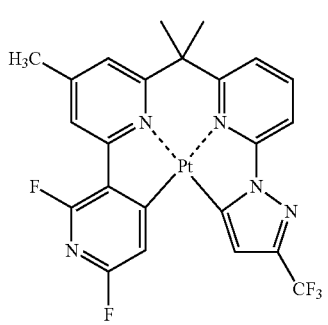
-continued
D-20
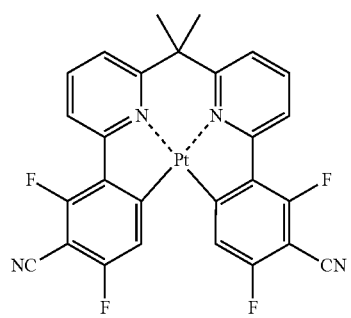
D-21
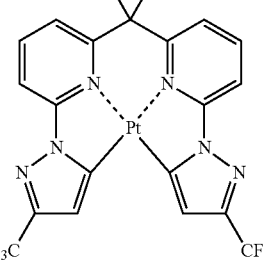
D-22
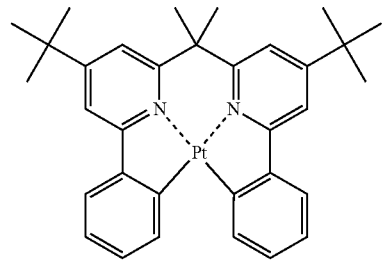
D-23
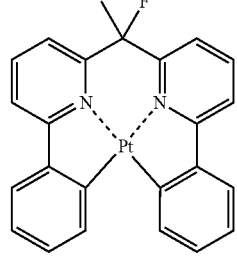
D-24
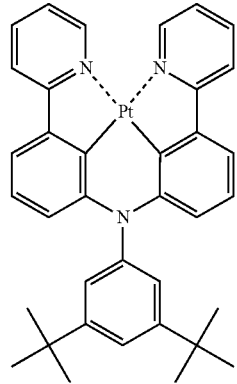

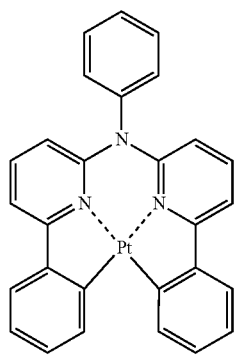
D-25
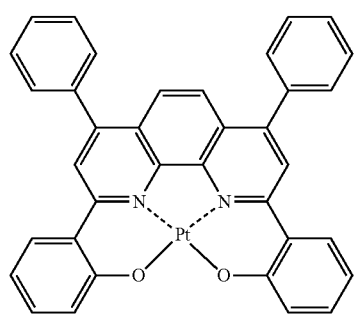
D-26
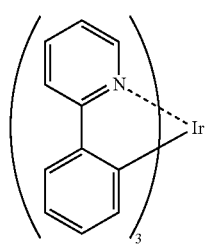
D-27
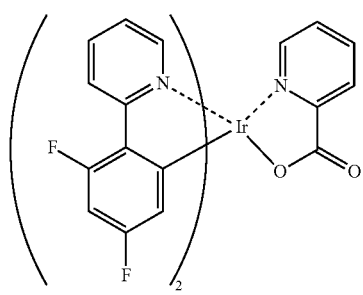
D-28
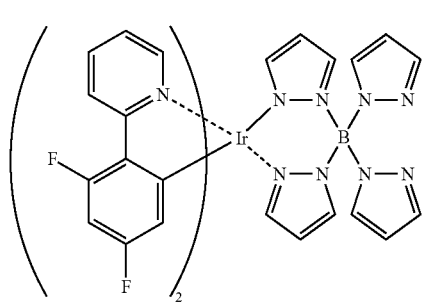
D-29
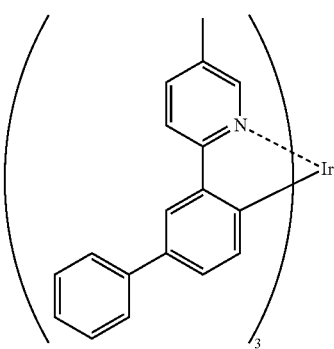
D-30
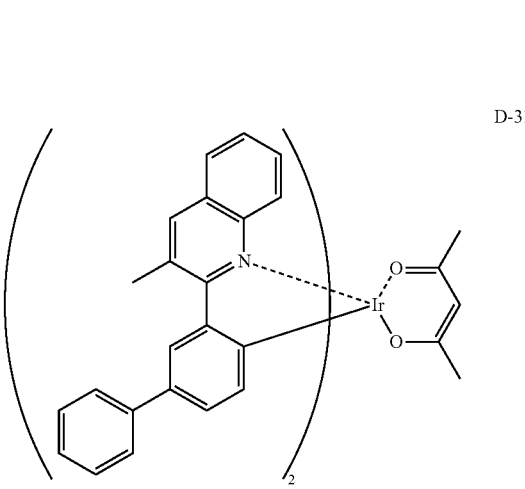
D-31
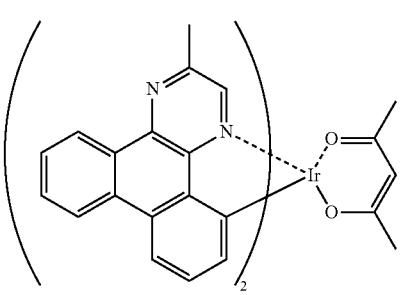
D-32
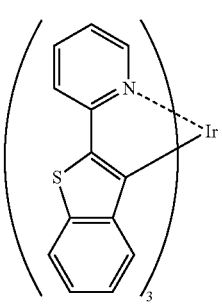
D-33

[Third Chemical Formula]

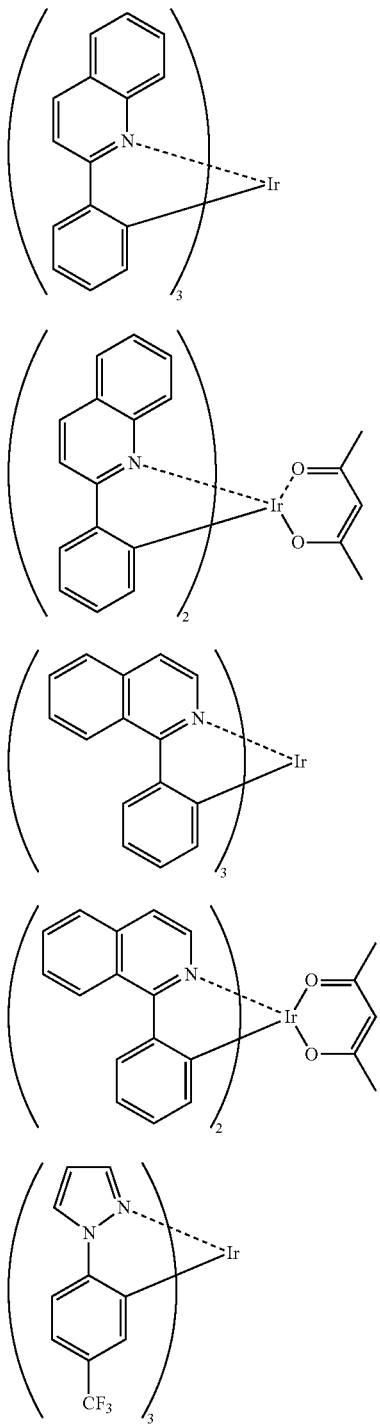

D-34
D-35
D-36
D-37
D-38

———Fluorescent Light-Emitting Material———

There are no particular restrictions on the aforementioned fluorescent light-emitting material, which can be suitably selected as dictated by the intended use, and examples include benzoxazole, benzoimidazole, benzothiazole, styrylbenzene, polyphenyl, diphenylbutadiene, tetraphenylbutadiene, naphthalimide, coumarin, pyran, perinone, oxadiazole, aldazine, pyridine, cyclopentadiene, bis-styrylanthracene, quinacridone, pyrrolopyridine, thiadiazolopyridine, cyclopentadiene [sic][3], styrylamine, aromatic dimethylidene compounds, condensed polycyclic aromatic compounds (such as anthracene, phenanthroline, pyrene, perylene, rubrene, and pentacene), various types of metal complex (typified by metal complexes of 8-quinolynol, pyromethene complexes, and rare earth complexes), polymer compounds (such as polythiophene, polyphenylene, and polyphenylenevinylene), organic silanes, and derivatives of these.

[3] Translator's note: apparent error in the original; "cyclopentadiene" is repeated in this list.

———Host Material———

A hole transporting host material with excellent hole transport properties (sometimes referred to as a "hole transporting host") or an electron transporting host compound with excellent electron transport properties (sometimes referred to as an "electron transporting host") can be used as the aforementioned host material.

———Hole Transporting Host Material———

Examples of the aforementioned hole transporting host material include the following materials: namely, pyrrole, indole, carbazole, azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, conductive high-molecular-weight oligomers such as thiophene oligomers and polythiophenes, organic silanes, carbon films, and derivatives of these.

Of these, indole derivatives, carbazole derivatives, aromatic tertiary amine compounds, thiophene derivatives, and compounds having a carbazole group in the molecule are preferable, and compounds having a t-butyl-substituted carbazole group are more preferable.

———Electron Transporting Host Material———

Examples of the aforementioned electron transporting host material include pyridine, pyrimidine, triazine, imidazole, pyrazole, triazole, oxazole, oxadiazole, fluorenone, anthraquinodimethane, anthrone, diphenylquinone, thiopyran dioxide, carbodiimide, fluorenylidenemethane, distyrylpyradine, fluorine-substituted aromatic compounds, heterocyclic tetracarboxylic acid anhydrides (such as naphthalene [and] perylene), phthalocyanine, and derivatives of these (which may form a condensed ring with another ring), as well as various types of metal complex typified by metal complexes of 8-quinolynol derivatives, metal phthalocyanine, and metal complexes having benzoxazole or benzothiazole as a ligand. Of these, metal complex compounds are preferable in terms of durability, and a metal complex containing a ligand which has at least one nitrogen atom, oxygen atom, or sulfur atom and which is coordinated with the metal is more preferable. Examples of the aforementioned metal complex electron transporting host include the compounds described in publications of Japanese Laid-Open Patent Applications 2002-235076, 2004-214179, 2004-221062, 2004-221065, 2004-221068, and 2004-327313.

The following compounds can be listed as concrete examples of the aforementioned hole transporting host material and electron transporting host material, but [the compounds] are not limited to these:

[Fourth Chemical Formula]
H-1
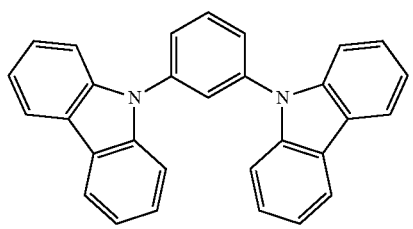
H-2
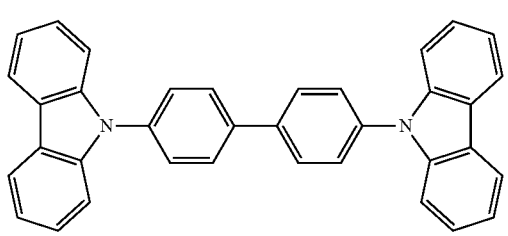
H-3
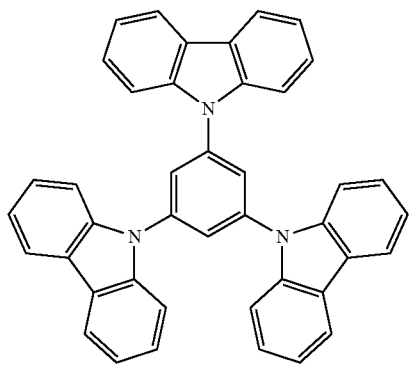
H-4
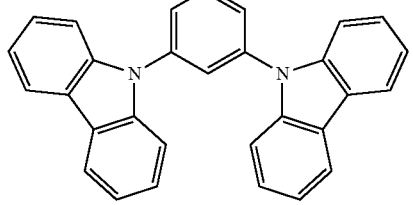
H-5
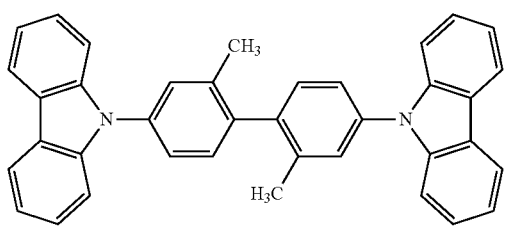
H-6
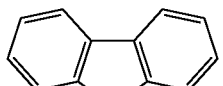
[Fifth Chemical Formula]
H-7
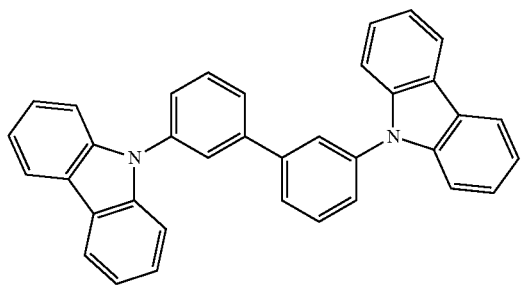
H-8
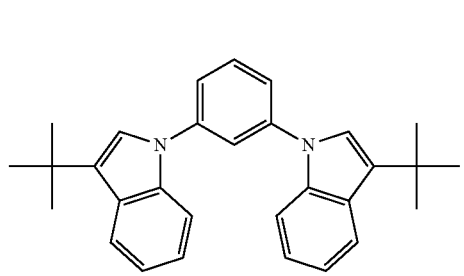

H-9
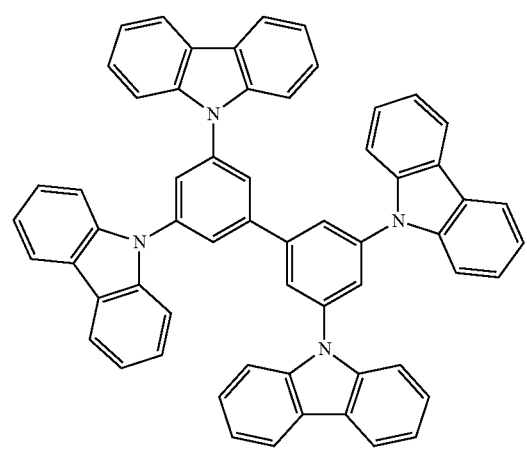
H-10
H-11
H-12
H-13
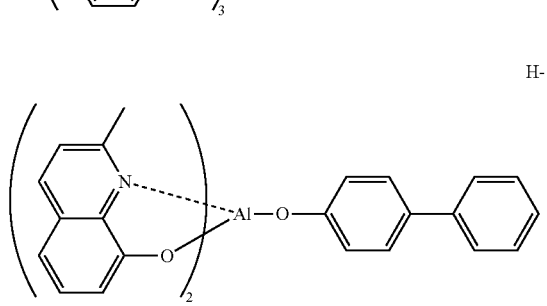
H-14
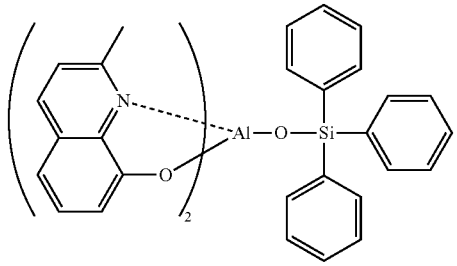
H-15
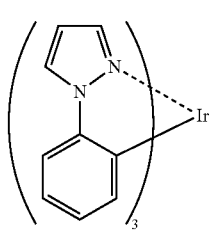
H-16
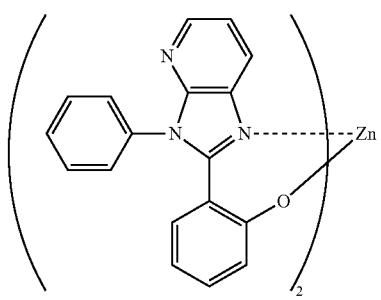
H-17
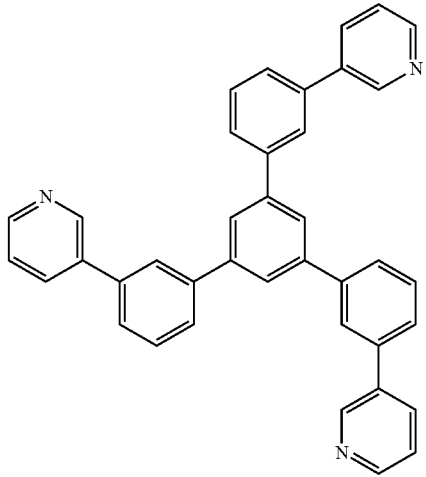

H-18

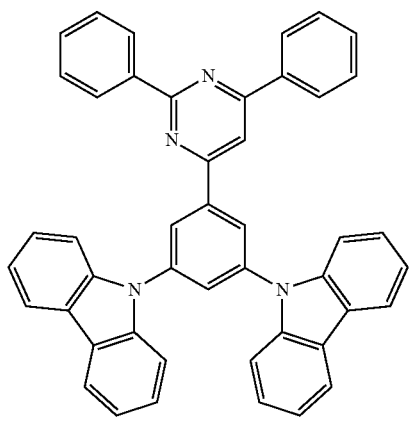

H-19

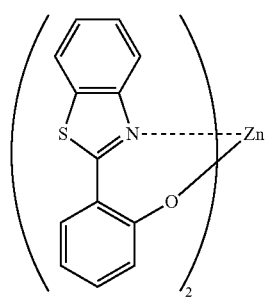

[Sixth Chemical Formula]

H-20

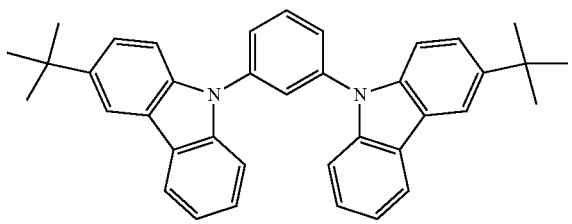

H-21

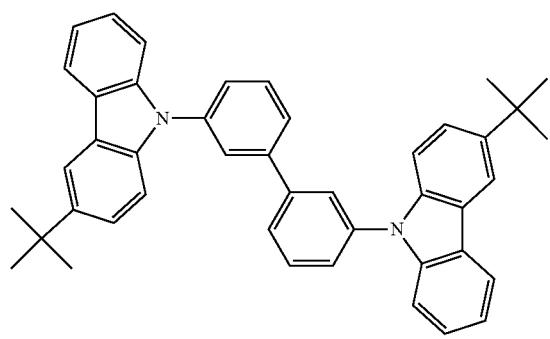

H-22

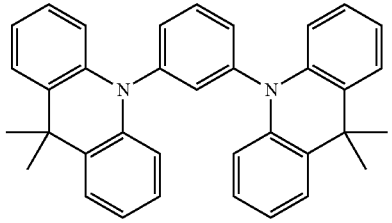

—Hole Injection Layer and Hole Transport Layer—

The aforementioned hole injection layer or the aforementioned hole transport layer is a layer having the function of accepting holes from the anode or from a layer on the anode side and transporting [the holes] to the cathode side. The hole injection material and hole transport material used in these layers may be a low-molecular-weight compound or a high-molecular-weight compound. In concrete terms, the layers preferably contain a pyrrole derivative, a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidine compound, a phthalocyanine compound, a porphyrin compound, a thiophene derivative, an organosilane derivative, carbon, or the like.

An electron-accepting dopant can also be contained in the aforementioned hole injection layer or the aforementioned hole transport layer. Either an inorganic compound or organic compound can be used as the electron-accepting dopant introduced into the aforementioned hole injection layer or hole transport layer as long as it has the property of accepting electrons and will oxidize an organic compound.

In concrete terms, examples of inorganic compounds include metal halides (such as ferric chloride, aluminum chloride, gallium chloride, indium chloride, and antimony pentachloride) and metal oxides (such as vanadium pentoxide and molybdenum trioxide). In the case of an organic compound, compounds having as a substituent a nitro group, a halogen, a cyano group, a trifluoromethyl group, or the like, quinone compounds, acid anhydride compounds, fullerenes, and so forth can be used favorably.

These electron-accepting dopants may be used singly, or two or more types may be used. Although the amount in which the electron-accepting dopant is used will depend on the type of material, it is preferably 0.01 to 50 wt %, more preferably 0.05 to 40 wt %, and even more preferably 0.1 to 30 wt %, with respect to the hole transport layer material.

The aforementioned hole injection layer or hole transport layer may have a single-layer structure composed of one or more types of the aforementioned materials, or may have a multilayer structure composed of a plurality of layers of the same composition or different compositions.

—Electron Injection Layer and Electron Transport Layer—

The aforementioned electron injection layer or the aforementioned electron transport layer is a layer having the functions of accepting electrons from the cathode or a layer on the cathode side and transporting [the electrons] to the anode side. The electron injection material or electron transport material used in these layers may be a low-molecular-weight compound or a high-molecular-weight compound.

In concrete terms, it is preferable to [use] a layer containing a pyridine derivative, a quinoline derivative, a pyrimidine derivative, a pyrazine derivative, a phthalazine derivative, a phenanthoroline derivative, a triazine derivative, a triazole derivative, an oxazole derivative, an oxadiazole derivative, an imidazole derivative, a fluorenone derivative, an anthraquinodimethane derivative, an anthrone derivative, a diphenylquinone derivative, a thiopyrane dioxide derivative, a carbodiimide derivative, a fluorenylidenemethane derivative, a distyrylpyradine derivative, an aromatic tetracarboxylic acid anhydride such as perylene or naphthalene, a phthalocyanine derivative, various types of metal complex typified by a metal complex of an 8-quinolinol derivative, a metal phthalocyanine, and a metal complex containing benzoxazole or benzothiazole as a ligand, an organosilane derivative typified by silole, or the like.

The aforementioned electron injection layer or electron transport layer can contain an electron-donating dopant. The electron-donating dopant introduced into the aforementioned electron injection layer or electron transport layer may be any material having an electron-donating property and a property for reducing organic compounds, and alkali metals such as lithium, alkaline earth metals such as magnesium, transition metals including rare earth metals, reductive organic compounds, and the like are favorably used. As metals, those having a work function of 4.2 eV or less can be particularly favorably used, and concrete examples include lithium, sodium, potassium, beryllium, magnesium, calcium, strontium, barium, yttrium, cesium, lanthanum, samarium, gadolinium, and ytterbium. Furthermore, examples of reductive organic compounds include nitrogen-containing compounds, sulfur-containing compounds, and phosphorus-containing compounds.

These electron-donating dopants may be used singly, or two or more types may be used. The amount in which the electron-donating dopant is used will vary with the type of material, but it is preferably 0.1 to 99 wt %, more preferably 1.0 to 80 wt %, and particularly preferably 2.0 to 70 wt %, with respect to the electron transport layer material.

The aforementioned electron injection layer or the aforementioned electron transport layer may have a single-layer structure composed of one or more types of the aforementioned materials or may have a multilayer structure composed of a plurality of layers of the same composition or different compositions.

—Hole Blocking Layer and Electron Blocking Layer—

The aforementioned hole blocking layer is a layer having the function of preventing holes transported from the anode side to the organic light-emitting layer from passing through to the cathode side, and is usually provided as an organic compound layer adjacent to the light-emitting layer on the cathode side.

Meanwhile, the aforementioned electron blocking layer is a layer having the function of preventing electrons transported from the cathode side to the organic light-emitting layer from passing through to the anode side, and is usually provided as an organic compound layer adjacent to the organic light-emitting layer on the anode side.

Examples of the compound constituting the aforementioned hole blocking layer include aluminum complexes such as BAlq, triazole derivatives, and phenanthroline derivatives such as BCP. Compounds given for the hole transport material above can be utilized as examples of the compound constituting the electron blocking layer.

The thickness of [each of] the aforementioned hole blocking layer and electron blocking layer is preferably 1 to 500 nm, more preferably 5 to 200 nm, and even more preferably 10 to 100 nm. Furthermore, the aforementioned hole blocking layer and electron blocking layer may have a single-layer structure composed of one or more types of the aforementioned materials or may have a multilayer structure composed of a plurality of layers of the same composition or different compositions.

Moreover, of the faces where the organic layer is in contact with the layers adjacent to this organic layer, if the surface area of the face closer to the reflector layer is designated as S ($\mu m^2$), and the thickness of the low refractive-index layer is designated as D ($\mu m$), it is preferable for [the relationship] $D/S \geq 0.04$ to be satisfied.

The aforementioned D/S more preferably satisfies $0.04 \leq D/S \leq 9$, even more preferably satisfies $0.16 \leq D/S$—4, and still more preferably satisfies $0.25 \leq D/S \leq 1$.

It is preferable for the aforementioned D/S to satisfy $D/S \geq 0.04$ because light reflected from the reflector will tend to return more efficiently to the organic electroluminescent element, and the light extraction efficiency will be increased.

Second Transparent Electrode

There are no particular restrictions on the components that make up the second transparent electrode as long as a transparent electrode can be formed, and [the components] can be suitably selected as dictated by the intended use. The components that make up the second transparent electrode may contain organic compounds or inorganic compounds, or may contain a mixture of these, for example.

The same components that make up the first transparent electrode can be used as the components that make up the second transparent electrode. In addition, the preferable components that make up the second transparent electrode and the ranges of preferred modes of the second transparent electrode are also the same as those of the first transparent electrode.

Furthermore, metal oxides commonly used as transparent electrodes in organic electroluminescent elements can be favorably used as the components that make up the second transparent electrode. Examples of such metal oxides include tin-doped indium oxide (ITO; refractive index (n)=2.0), zinc-doped indium oxide (IZO), ZnO (refractive index (n)=1.95), $SnO_2$ (refractive index (n)=2.0), $In_2O_3$ (refractive index (n)=1.9 to 2.0), and $TiO_2$ (refractive index (n)=1.90). Other metal oxides can also be used, such as zinc oxide doped with aluminum or indium, magnesium indium oxide, and nickel tungsten oxide. Besides these oxides, it is also possible to use metal nitrides such as gallium nitride, metal selenides such as zinc selenide, and metal sulfides such as zinc sulfide as the cathode. Gold, silver, copper, and high refractive-index transparent materials such as ZnS, $TiO_2$, ITO, and other such metal thin-film sandwiches can also be used. Of these, ITO and IZO are particularly preferable.

The second transparent electrode preferably contains at least one type of transparent particle (light-diffusing particles) with a primary particle size of 0.5 $\mu m$ or more. The range of particles that can be used as the aforementioned light-diffusing particles is the same as that of the light-diffusing particles contained in the first transparent electrode, and the preferred ranges are also the same.

The amount in which the light-diffusing particles are contained in the second transparent electrode can be suitably selected from the same range as that for the first transparent electrode, and the preferred ranges are also the same.

When the second transparent electrode contains light-diffusing particles, it is preferable for the second transparent electrode to contain a conductive matrix. The range of the matrixes that can be used as the aforementioned conductive matrix is the same as that of the conductive matrix that can be contained by the first transparent electrode, and the preferred ranges are also the same.

Moreover, it is preferable if the content rate N2 (vol %) of the light-diffusing particles contained in the aforementioned second transparent electrode and the film thickness L2 (μm) of the aforementioned second transparent electrode satisfy the relationship L2×N2≥200.

L2×N2 is preferably at least 200 and no more than 800, more preferably at least 220 and no more than 700, and even more preferably at least 250 and no more than 500.

If L2×N2 is at least 200, there will be a higher probability that the light transmitted through the second transparent electrode will strike the light-diffusing particles, and that the forward scattering of the light will proceed sufficiently in the second transparent electrode. It is preferable for the forward scattering of the light to proceed sufficiently because more of the light will be radiated to the interface with the substrate, and the light extraction efficiency will increase.

From the standpoint of conductivity, the film thickness of the second transparent electrode is preferably at least 30 nm and no more than 1 μm, more preferably at least 50 nm and no more than 500 nm, and even more preferably at least 100 nm and no more than 300 nm.

Low Refractive-Index Layer with Refractive Index of 1.3 or Less

If a second electrode is used as a reflecting electrode in order to extract the light emitted from the organic light-emitting layer or the light that has undergone rearward scattering at the light extraction layer, then [light] can be emitted to the side of the light extraction layer. However, because the reflecting electrode is a metal electrode, the metal absorbs the light, and particularly light on the high angle side, resulting in loss. Because the organic electroluminescent element of the present invention has the low refractive-index layer with a refractive index of 1.3 or less, the refractive index differential between the second transparent electrode and this low refractive-index layer can be utilized to reflect high-angle light to the OLED element (that is, the light extraction side) without it being absorbed by the metal electrode, which makes it possible to increase the light extraction efficiency.

There are no particular restrictions on the components that make up the low refractive-index layer with a refractive index of 1.3 or less as long as [the condition of] the refractive index being 1.3 or less is satisfied, but 1.2 or less is preferable, 1.1 or less is more preferable, and 1.05 or less is even more preferable.

There are no particular restrictions on the method for forming the low refractive-index layer with a refractive index of 1.3 or less, which can be suitably selected as dictated by the intended use. Examples of materials with a low refractive index include the gases such as oxygen, nitrogen, and carbon dioxide. [This layer] can be formed, for example, by adjusting the position where the substrate is sealed so as to achieve the low refractive-index layer with a refractive index of 1.3 or less in the desired thickness when imparting a reflecting layer or diffusing reflector plate (described later) to the back face (inside) of a sealing can (described later) and the sealing the organic layer side of the substrate.

Reflector Layer

The reflector layer reflects generated light and allows it to be extracted efficiently from the light extraction face. The optical reflectance of this reflector layer is preferably at least 50%, more preferably at least 70%, and even more preferably at least 90%.

The reflector layer is preferably formed by vapor deposition. Preferably, it is [made of] a metal or metal oxide, and more preferably a metal such as aluminum, silver, gold, or chromium.

In addition to the aforementioned metals, the reflector layer is also favorably constituted by a diffusing reflector plate with an optical reflectance of at least 90%.

The reflector layer is preferably vapor-deposited to a thickness of 0.01 to 1 μm and more preferably 0.05 to 0.2 μm.

Second Layer Constituting First Transparent Electrode (Planarization Layer of First Transparent Electrode)

The organic electroluminescent element of the present invention can be such that the aforementioned first transparent electrode is a transparent electrode composed of two layers: a first layer containing at least one type of transparent particle with a primary particle size of 0.5 μm or more and a second layer containing no transparent particles with a primary particle size of 0.5 μm or more but containing particles with a primary particle size of 100 nm or less (hereinafter also referred to as the "planarization layer of the first transparent electrode").

For the constituent components of the second layer constituting the aforementioned first transparent electrode, it is possible to use components that are the same as the constituent components of the first layer constituting the first transparent electrode, except that no transparent particles with a primary particle size of 0.5 μm or more (light-diffusing particles) are contained. In addition, the preferred constituent components and ranges of preferred modes of the second layer constituting the first transparent electrode are the same as those discussed for the ranges of the first transparent electrode, except that no light-diffusing particles are contained.

The absolute value of the difference between the refractive index of the constituent components of the second layer constituting the aforementioned first transparent electrode and the refractive index of the components left over after eliminating the transparent particles with a primary particle size of 0.5 μm or more from the constituent components of the first layer constituting the aforementioned first transparent electrode is preferably 0.02 or less. By adjusting the refractive index of the second layer constituting the first transparent electrode in this manner, it is possible to prevent loss of light extraction due to total reflection and other such effects that occur at the interface between the first layer and the second layer that constitute the first transparent electrode.

From the standpoint of achieving both the overall flatness of the first transparent electrode including the first layer and the second layer and the transparency of the aforementioned second layer, the thickness of the second layer constituting the aforementioned first transparent electrode is preferably at least 50 nm and no more than 4 μm, more preferably at least 100 nm and no more than 1 μm, and even more preferably at least 200 nm and no more than 500 nm.

Wiring with Lower Resistance than First Transparent Electrode

In the organic electroluminescent element of the present invention, it is preferable to have wiring with a lower resistance than the aforementioned first transparent electrode (also referred to as "auxiliary wiring") between the first transparent electrode and the substrate. As a result of having the wiring with a lower resistance than the first transparent electrode, it is possible to lower the overall resistance as the transparent electrode (the first transparent electrode and the wiring combined) and to prevent uneven light emission by suppressing the drop in voltage even in cases where the light-emitting face of the organic electroluminescent element has a large surface area. With light extraction in which diffusion is used, light confined inside the organic layer or the substrate can be efficiently extracted by uniformly emitting the light such that the light-emitting face is broad and also such that there is no uneven light emission. More preferably, the organic electroluminescent element of the present invention is constituted such that auxiliary wiring is provided between the first transparent electrode and the substrate, and the first transparent electrode covers the auxiliary wiring. In particular, the first transparent electrode can be provided so as to cover the wiring by forming the first transparent electrode by a coating method. Therefore, in the organic electroluminescent element, a constitution is possible in which the wiring will not come into contact with the organic layer, which makes the emission of light possible from the entire face of the light-emitting layer.

The auxiliary wiring preferably contains a metal, more preferably contains silver, aluminum, gold, or copper, and even more preferably contains silver or aluminum.

The auxiliary wiring can be formed, for example, by photolithography after vacuum vapor deposition of the aforementioned metal, by etching using a mask, or the like. Furthermore, it can also be formed by coating, printing, or the like with a conductive ink containing the aforementioned metal.

From the standpoints of lowering the resistance of the first transparent electrode and suppressing the formation of bumps on the surface caused by the auxiliary wiring, the thickness of the auxiliary wiring is preferably at least 10 nm and no more than 3 µm, more preferably at least 30 nm and no more than 1 µm, and even more preferably at least 50 nm and no more than 500 nm.

From the standpoints of blocking light and lowering the resistance of the first transparent electrode, the width of the auxiliary wiring is preferably at least 1 µm and no more than 1 mm, more preferably at least 5 µm and no more than 500 µm, and even more preferably at least 10 µm and no more than 200 µm.

Sealing Can

With the organic electroluminescent element of the present invention, at least the aforementioned second transparent electrode and the aforementioned organic light-emitting layer are preferably sealed inside a sealing can, and more preferably the aforementioned first transparent electrode, the aforementioned second transparent electrode, and the aforementioned organic light-emitting layer are sealed inside the sealing can.

There are no particular restrictions on the aforementioned sealing can so long as it has a size, shape, structure, and so forth that allow the sealing of the organic electroluminescent element including the first transparent electrode, the second transparent electrode, and the organic layer, and it can be suitably selected as dictated by the intended use.

A moisture absorbent or an inert liquid may be sealed in the space between the aforementioned sealing can and the organic electroluminescent element that includes the first transparent electrode, the second transparent electrode, and the organic layer.

There are no particular restrictions on the aforementioned moisture absorbent, which can be suitably selected as dictated by the intended use, and examples include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, and magnesium oxide.

There are no particular restrictions on the aforementioned inert liquid, which can be suitably selected as dictated by the intended use, and examples include: paraffins; liquid paraffins; fluorine-based solvents such as perfluoroalkanes, perfluoroamines, and perfluoroethers; chlorine-based solvents; and silicone oils.

The aforementioned organic electroluminescent element can be configured as a device capable of full-color display.

Known methods for making the aforementioned organic electroluminescent element a full-color type include, for example, as discussed in "Gekkan Disupurei [*Monthly Display*]," September, 2000, pp. 33-37, a three-color light-emitting method in which a layer structure that emits light corresponding to each of the three primary colors (blue (B), green (G), and red (R)) is disposed on a substrate, a white method in which white light emitted by a layer structure intended for white light emission is passed through a color filter layer and separated into the three primary colors, and a color conversion method in which blue light emitted by a layer structure intended for blue light emission is passed through a fluorescent dye layer and converted into red (R) and green (G).

In this case, the laser power and the thickness are preferably adjusted as appropriate for each blue (B), green (G), and red (R) pixel.

Moreover, a flat light source of the desired emission colors can be obtained by using a combination of a plurality of layer structures of different emission colors obtained by [one of] the aforementioned methods. Examples include a white light-emitting light source that combines blue and yellow light-emitting devices, and a white light-emitting light source that combines blue (B), green (G), and red (R) organic electroluminescent elements.

The aforementioned organic electroluminescent element can be used favorably in a variety of fields such as lighting devices, computers, onboard displays, outdoor displays, household devices, commercial devices, consumer devices, traffic-related displays, clock and watch displays, calendar displays, luminescent screens, and acoustic devices.

WORKING EXAMPLES

Working examples of the present invention will be described below, but the present invention is not limited in any manner whatsoever by these working examples.

<Estimating Light Extraction Efficiency by Simulation>

The following simulations were conducted by Mie scattering theory using the following models and commercially available beam tracking software (ZEMAX-EE, a product of the ZEMAX Development Corporation):

—Reference Model (Calculation Model 1)—

The model shown in FIG. 1 is a calculation model for an organic electroluminescent element having a silver reflecting electrode, with no light extraction measures (scattering film or low refractive-index layer with a refractive index of 1.3 or less). This is utilized as a reference (comparative) element. The multiplying factor of the light extraction efficiency uses this element as a reference. Specifically, the multiplying factor for light extraction efficiency is defined by the following equation:

multiplying factor=light extraction efficiency of working element÷light extraction efficiency of reference element The light extraction efficiency here is defined by the following equation:

light extraction efficiency=optical energy emitted to the air÷optical energy emitted from the organic layer The organic electroluminescent element in the reference model shown in FIG. 1 is configured as follows:

It is an organic electroluminescent element made up of air, a transparent substrate (1) (BK7, made by Ohara, refractive index n of 1.5, attenuation coefficient k of 0, thickness of 0.7 mm), an organic layer (3) including a transparent electrode on the transparent substrate side (refractive index n of 1.8, absorptance of 10%, thickness of 2 μm, light-emitting region (3a) of 2 mm$^2$), and a silver reflecting electrode (6) (refractive index n of 0.18, attenuation coefficient k of 3.4). The element measured 50 mm square.

The property values used in the calculation were those on the d line of each material.

The configuration of the organic layer including a transparent electrode on the transparent substrate side comprises a transparent electrode, a hole injection layer, a hole transport layer, a light-emitting layer, an electron injection layer, and an electron transport layer.

According to Pioneer R&D Vol. 11, No. 1, pp. 21-28, the refractive index n of the light-emitting layer is 1.7 to 1.85. In addition, tin-doped indium oxide (ITO) (refractive index (n)=2.0), ZnO (refractive index (n)=1.95), SnO$_2$ (refractive index (n)=2.0), In$_2$O$_3$ (refractive index (n)=1.9 to 2.0), and TiO$_2$ (refractive index (n)=1.90), which are often used for transparent electrodes, have a refractive index that is greater than the refractive index of the organic layer, and do not affect the total reflection between the light-emitting layer and the air, so the refractive index n of the organic layer including the transparent electrode was set at 1.8.

Furthermore, as a result of the refractive index differential between the air and the organic electroluminescent element or between the stacked layers of the organic electroluminescent element when light emitted from the organic layer passes through the stacked layers of the organic electroluminescent element and is released into the air, there is light that is reflected inside the organic electroluminescent element. Light reflected inside the organic electroluminescent element is reflected again to the light extraction side by the reflecting electrode or the reflector layer, passes through the organic layer, and is released into the air. Every time light goes through the organic layer, it is absorbed in proportion to the attenuation coefficient of the organic material. Here, it is assumed that the absorptance every time light passes through the organic layer is 10%.

The distribution of light radiated from the organic layer to the transparent substrate (within n of 1.8) was a Lambertian distribution.

As the organic electroluminescent element, the one having the following structure and disclosed in Nature, Vol. 459, pp. 234-238 (May 14, 2009) was used:

glass (Ohara S-LAH53, refractive index n=1.8)/ITO (thickness: 90 nm)/MeO-TPD:NDP-2 (thickness: 45 nm)/NPB (thickness: 10 nm)/TCTA:Ir(MDQ)$_2$(acac) (thickness: 6 nm)/TCTA (thickness: 2 nm)/TPBi:FIrpic (4 nm)/TPBi (thickness: 2 nm)/TPBi:Ir(ppy)$_3$/TPBi (10 nm)/Bphen:Cs (thickness: 25 nm)/Ag (thickness: 100 nm).

Note that the distribution of light emitted from the light-emitting layer and radiated into the transparent substrate was assumed to be a Lambertian distribution as described in paragraph [0002] of a publication of Japanese Laid-Open Patent Application 2008-70198.

The light extraction efficiency obtained by simulation of calculation model 1 was approximately 32%. From this, the multiplying factor for the light extraction efficiency obtained by simulation for each calculation model is a multiplying factor with respect to this light extraction efficiency.

Reference Example 1

—Effect on Increasing Light Extraction Efficiency Due to Thickness L1 (μm) of Diffusion Scattering Film and Content Rate N1 (vol %) of Light-Diffusing Particles (Calculation Model 2)—

Figure 2:
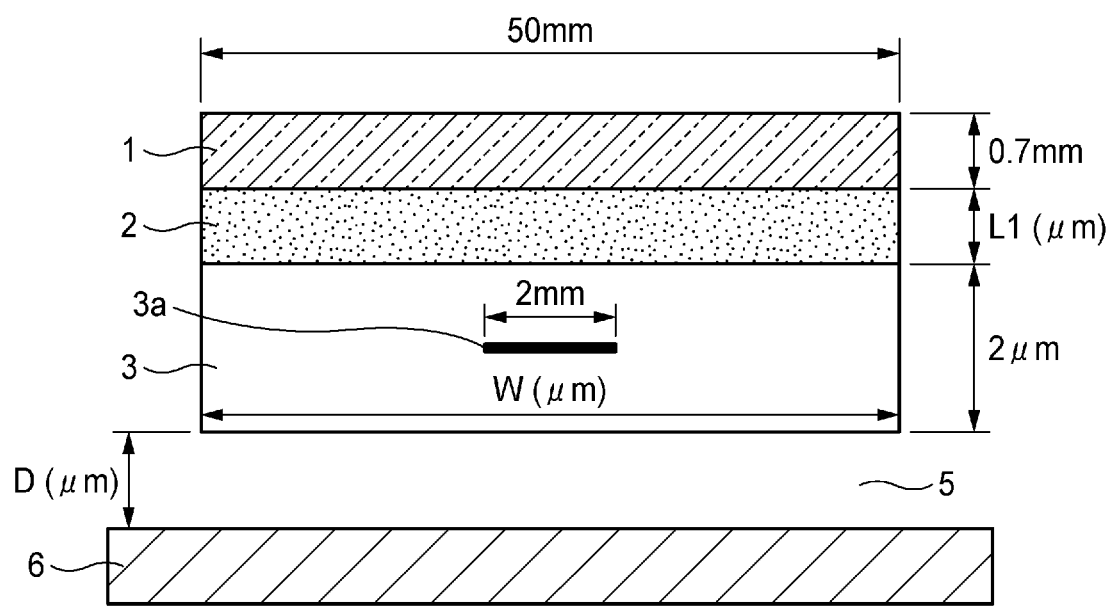
FIG. 2 is a schematic diagram illustrating the organic electroluminescent element in a calculation model 2.

Next, assuming an organic EL element having a coating-type conductive layer configuration and having a light extraction layer that was a microparticle diffusion layer with a high refractive-index binder (refractive index n: 1.8), the effect on increasing the light extraction efficiency due to the low refractive-index layer between the reflector layer and the organic layer including the transparent electrode and the distance of the low refractive-index layer was estimated according to calculation model 2 shown in FIG. 2. The reflector layer utilized here was a flat silver reflector. The element size was 50 mm square.

Calculation model 2 was configured as follows:

air/transparent substrate (1) (n of 1.5, k of 0, thickness of 0.7 mm)/coating-type conductive layer (2) (diffusion scattering film) having light extraction performance (polymer, refractive index nb of 1.8, attenuation coefficient k of 0, crosslinked acrylic particles, primary particle size [sic][4], refractive index np of 1.49, attenuation coefficient k of 0, content rate N1 (vol %) of light-diffusing particles, film thickness L1 (μm)/organic layer (3) (n of 1.8, absorptance 10%, thickness 2 μm, light-emitting region (3a) 2 mm square)/low refractive-index layer (5) (n of 1.0, k of 0, low refractive-index layer thickness D (μm)/silver reflector (6) (refractive index n of 0.18, attenuation coefficient k of 3.4).

[4] Translator's note: The numerical value for the primary particle size seems to be erroneously omitted in the original.

The configuration of the organic layer here was [as follows:] coating-type conductive layer/hole injection layer/hole transport layer/light-emitting layer/electron injection layer/electron transport layer/transparent electrode.

Of the faces where the organic layer is in contact with the layers adjacent to the organic layer, the face closer to the reflector layer was square, and [the length of] one side (hereinafter also referred to as "side length of the organic layer") was W (μm).

The coating-type conductive layer having light extraction performance was a microparticle diffusion scattering film made up of microparticles diffused in a conductive polymer with a high refractive index. The refractive index of the coating-type conductive layer having light extraction performance was nb 1.8. Moreover, the aforementioned microparticles had a primary particle size of 1.5 μm, a refractive index n of 1.49, and an attenuation coefficient k of 0.

——Simulation Results——

For calculation model 2, a simulation was conducted using the film thickness L1 (μm) of the coating-type conductive layer as a parameter, with the content rate N1 of the light-diffusing particles set at 10 vol %, 30 vol %, and 50 vol % and with D/W (where D (μm) is the thickness of the low refractive-index layer, and W (μm) is the side length of the organic layer) at a constant 0.5, and the multiplying factor of the light extraction efficiency was found with respect to the light extraction efficiency of calculation model 1. The results are shown in FIG. 3.

In addition, for calculation model 2, a simulation was conducted using D/W as a parameter, with the content rate of the light-diffusing particles set at a constant 50 vol % and the thickness of the coating-type conductive film at a constant 5 μm, and the multiplying factor of the light extraction efficiency was found with respect to the light extraction efficiency of calculation model 1. The results for calculation model 2 are shown in FIG. 4 along with the results for calculation model 3 (described later).

The property values used in the calculation are the data on the d line of the material.

It was found from the results in FIG. 3 that it is preferable in terms of significantly increasing the light extraction efficiency if the film thickness L1 (μm) of the diffusion scattering film and the content rate N1 (vol %) of the light-diffusing particles satisfy L1×N1≥200.

Reference Example 2

——Effect on Increasing Light Extraction Efficiency Due to Distance of Air Gap and Coating-type Conductive Layer on Both Sides of Organic Layer (Calculation Model 3)——
——Simulation Model——

Figure 5:
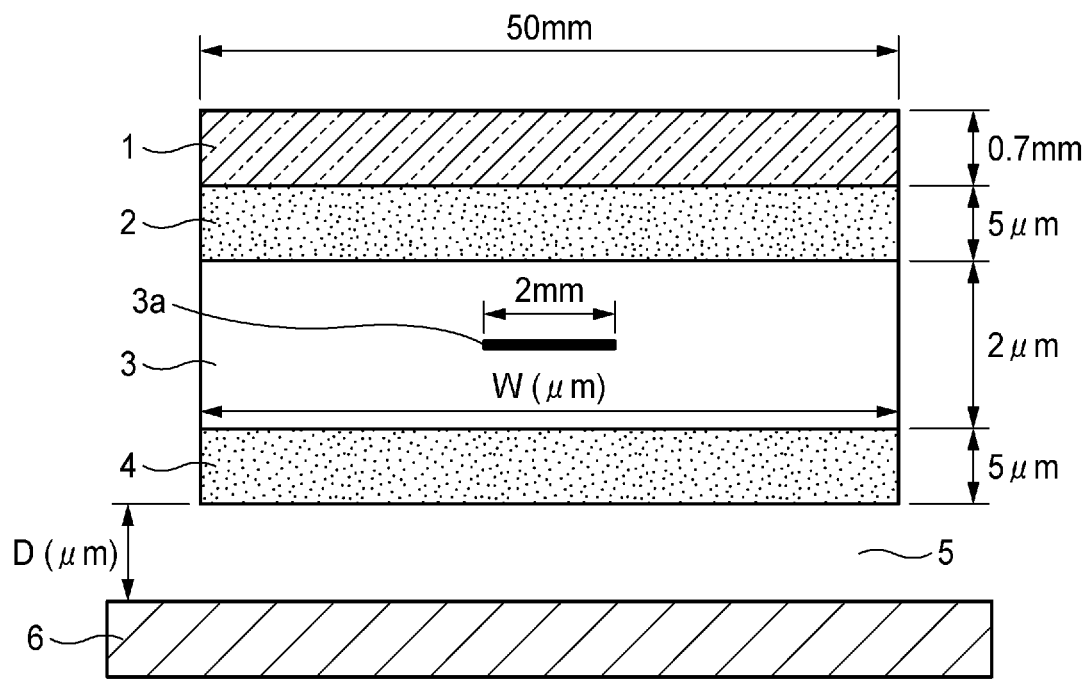
FIG. 5 is a schematic diagram illustrating the organic electroluminescent element in calculation model 3.

As was described above, light emitted from the light-emitting layer is absorbed by the organic layer every time it passes through the organic layer, resulting in loss. In order to solve this [problem], a coating-type conductive layer having light extraction performance is provided on both sides of the organic layer as shown in FIG. 5 such that more light will be extracted each time the light goes through the organic layer and advances to the low refractive-index layer boundary. The element size is 50 mm square.

Calculation model 3 was configured as follows:
air/transparent substrate (1) (n of 1.5, k of 0, thickness of 0.7 mm)/coating-type conductive layer (2) (microparticle diffusion scattering film) (polymer, refractive index nb of 1.8, attenuation coefficient k of 0, crosslinked acrylic particles, primary particle size of 1.5 μm, refractive index np of 1.49, attenuation coefficient k of 0, content rate of light-diffusing particles 50 vol %, scattering film thickness of 5 μm/organic layer (3) (n of 1.8, absorptance of 10%, thickness of 2 μm, light-emitting region (3a) 2 mm square)/coating-type conductive layer (4) (microparticle diffusion scattering film) (polymer, refractive index nb of 1.8, attenuation coefficient k of 0, crosslinked acrylic particles, primary particle size of 1.5 μm, refractive index np of 1.49, attenuation coefficient k of 0, content rate of light-diffusing particles 50 vol %, film thickness of 5 μm)/low refractive-index layer (5) (n of 1.0, k of 0, low refractive-index layer thickness D (μm)/silver reflector (6) (refractive index n of 0.18, attenuation coefficient k of 3.4, thickness of 1 mm).

The configuration of the organic layer here was [as follows:] coating-type conductive layer/hole injection layer/hole transport layer/light-emitting layer/electron injection layer/electron transport layer/transparent electrode.

For calculation model 3, a simulation was conducted in the same manner as with calculation model 2, using D/W as a parameter, and the multiplying factor of the light extraction efficiency was found with respect to the light extraction efficiency of calculation model 1.

The simulation results for D/W in calculation model 2 and calculation model 3 are compiled in FIG. 4.
——Simulation Results——

FIG. 4 is a diagram showing the calculation results of the relationship between D/W and the light extraction efficiency in the case of an organic electroluminescent element in which the content rates N1 and N2 of the light-diffusing particles are 50 vol %, the thickness L1 of the diffusion scattering film 1 is 5 μm, the thickness L2 (μm) of the diffusion scattering film 2 is 5 μm, the thickness of the low refractive-index layer is D (μm), and the side length of the organic layer is W (μm).

It was found from the results in FIG. 4 that it is preferable in terms of further increasing the light extraction efficiency if the thickness D (μm) of the low refractive-index layer and the side length W (μm) of the organic layer satisfy [the relationship] D/W≥0.2.

Meanwhile, of the faces where the organic layer is in contact with the layers adjacent to the organic layer, if S (μm$^2$) is used to consider the surface area of the face closer to the reflector layer, the aforementioned surface area S and the aforementioned side length W of the organic layer satisfy the relationship S=W$^2$.

Thus, in order to raise the light extraction efficiency, of the faces where the organic layer is in contact with its adjacent layers, if the surface area of the face closer to the reflector layer is designated as S (μm$^2$), it was found that it is preferable for the aforementioned D to be at least 0.04 times with respect to S.

<Production of Organic Electroluminescent Element>

Given the aforementioned simulation results, the following organic electroluminescent element was produced, and the light extraction efficiency was measured.
——Production of Diffusion Conductive Layer Coating Solution 1——

PEDOT-PSS (poly(3,4-ethylenedioxythiophene)-poly (styrenesulfonic acid), refractive index: 1.5) was doped with a slurry material in which titanium oxide particles (primary particle size (φ) of 100 nm or less) had been dispersed, and [this product] was thoroughly stirred with an omnimixer to obtain a conductive binder material.

For the volumetric ratio between the PEDOT-PSS and the titanium oxide particles, a ratio may be set such that the required refractive index can be obtained, and with pure titanium oxide, [the ratio] PEDOT-PSS:titanium oxide is approximately 7:3 to 6:4, but with a mixture or particles having a shell/core structure, the ratio may be suitably adjusted so as to obtain the required refractive index. Transparent particles with a high refractive index (such as zirconium oxide particles or another such transparent material in the form of particles) may be added instead of titanium oxide, or a slurry or sol may be added.

Subsequently, the aforementioned "conductive binder material" was doped with light-diffusing particles (crosslinked acrylic particles with a primary particle size (φ) of 1.5 μm (material name: MX-150)) while being stirred with a stirrer. The light-diffusing particles were then thoroughly dispersed with an omnimixer.

An inorganic material (such as zirconium oxide and titanium oxide) with a size of approximately 1 to 10 μm may be added instead of the crosslinked acrylic or other resin particles.

The refractive index of the conductive binder was 1.8 (PEDOT-PSS+titanium oxide slurry), and the refractive index of the light-diffusing particles was 1.49 (in the case of crosslinked acrylic particles), so there was a sufficiently large difference between the refractive indexes, and sufficient diffusion was obtained in light extraction even with a thin film.

The volumetric ratio between the conductive binder material and the light-scattering particles was set at 50:50 to 90:10 (conductive binder:light-diffusing particles MX-150).

—Production of Diffusion Conductive Layer Coating Solution 2—

Just as in the "Production of Diffusion Conductive Layer Coating Solution 1" above, PEDOT-PSS was doped with a slurry material in which titanium oxide particles had been dispersed, and [this product] was thoroughly stirred with an omnimixer to obtain a conductive binder material.

The volumetric ratio between the PEDOT-PSS and the titanium oxide particles will only need to be set to a ratio such that the required refractive index can be obtained, and here, the volumetric ratio between the PEDOT-PSS and the titanium oxide particles was set at 50:50 to 90:10.

Transparent particles with a high refractive index (such as zirconium oxide particles or another such transparent material in the form of particles) may be added instead of titanium oxide.

—Glass Substrate Surface Treatment—

The glass substrate was subjected to a silane coupling treatment to increase the adhesion between the diffusion layer and the glass.

—Film Formation of Photolithographic Auxiliary Wiring—

After the diffusion layer or planarization layer was formed, a film of aluminum was formed by vacuum vapor deposition in a thickness of 100 to 200 nm as auxiliary wiring, and this was formed into the auxiliary wiring shape in a photolithography step.

—Film Formation of Mask Auxiliary Wiring—

After the diffusion layer or planarization layer was formed, a film of aluminum was formed by vacuum vapor deposition in a thickness of 200 nm as auxiliary wiring, and this was formed with a metal mask. The mask gives a shape that is more rounded than a wiring shape obtained by etching.

—Film Formation of First Transparent Electrode (Diffusion Conductive Layer 1)—

The aforementioned diffusion conductive layer coating solution 1 was applied over the aforementioned substrate with an edge coater. After the coating, it was dried and cured in a 120° C. environment, which gave a first transparent electrode with a thickness L1 of 1 to 25 μm.

—Film Formation of Second Layer (Planarization Layer) Forming First Transparent Electrode—

Depending on the degree of irregularity on the surface of the diffusion conductive layer 1, the diffusion conductive layer 1 may be coated with a diffusion conductive layer coating solution 2. In this case, the first transparent electrode will be composed of two layers: a first layer containing at least one type of transparent particle with a primary particle size of 0.5 μm or more and a second layer that does not contain transparent particles with a primary particle size of 0.5 μm or more but does contain particles with a primary particle size of 100 nm or less.

—Production of Organic Layer—

A hole injection layer 1 was formed over the first electrode on the substrate produced by the aforementioned method by laminating HAT-CN in a thickness of 10 nm with a vacuum vapor deposition device.

A hole injection layer 2 was formed over the aforementioned hole injection layer 1 by co-vapor deposition of 2-TNATA (4,4',4"-tris(N,N-(2-naphthyl)-phenylamino)triphenylamine: 99.8 wt %) and F4-TCNQ (0.2 wt %) in a thickness of 160 nm.

α-NPD (bis[N-(1-naphthyl)-N-phenyl]benzidine) was laminated in a thickness of 10 nm over the aforementioned hole injection layer 2 to form a hole transport layer.

mCP (60 wt %) and a light-emitting material A (40 wt %) were co-vapor-deposited in a thickness of 30 nm over the aforementioned hole transport layer to form a light-emitting layer.

Furthermore, BAlq (bis-(2-methyl-8-quinolinolato)-4-(phenyl-phenolate)-aluminum(III) was laminated in a thickness of 40 nm over the light-emitting layer to form an electron transport layer, thus obtaining an organic layer.

[Seventh Chemical Formula]

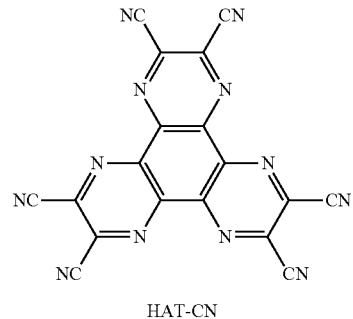 [SMILES: N#Cc1nc2c3nc(C#N)c(C#N)nc3c3nc(C#N)c(C#N)nc3c2nc1C#N]

HAT-CN

[Eighth Chemical Formula]

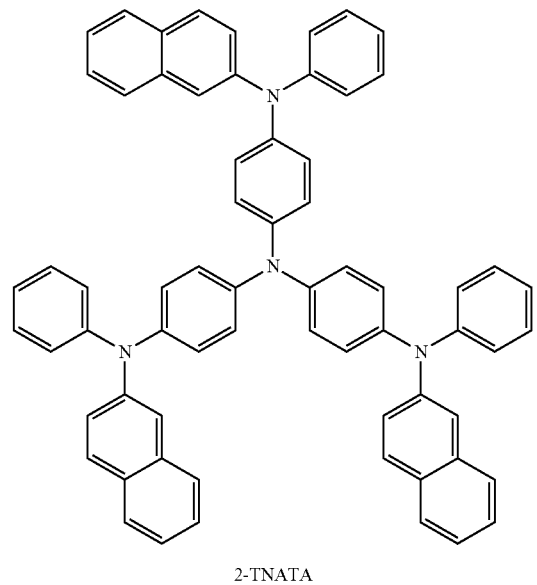 [SMILES: c1ccc(N(c2ccc(N(c3ccc(N(c4ccccc4)c4ccc5ccccc5c4)cc3)c3ccc(N(c4ccccc4)c4ccc5ccccc5c4)cc3)cc2)c2ccc3ccccc3c2)cc1]

2-TNATA

[Ninth Chemical Formula]

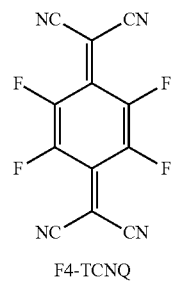 [SMILES: N#CC(C#N)=c1c(F)c(F)c(=C(C#N)C#N)c(F)c1F]

F4-TCNQ

[Tenth Chemical Formula]

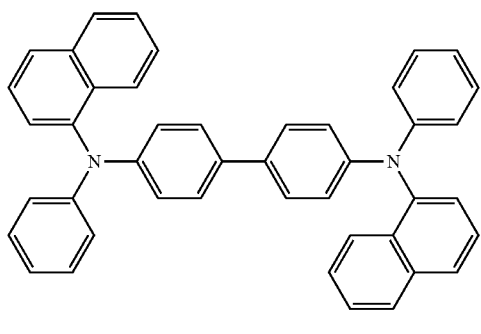

α-NPD

[Eleventh Chemical Formula]

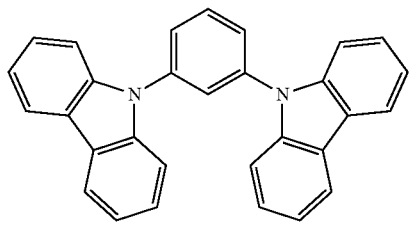

mCP

[Twelfth Chemical Formula]

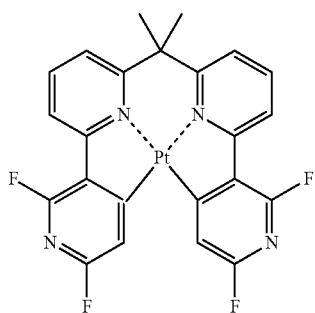

Light-Emitting Material A

[Thirteenth Chemical Formula]

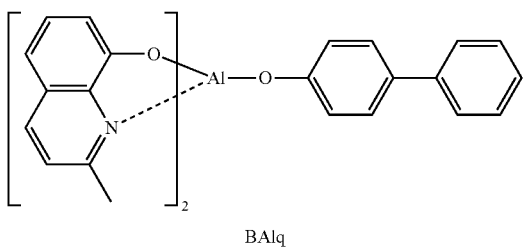

BAlq

—Film Formation of Second Transparent Electrode (ITO)—

ITO was formed in a thickness of 100 nm over the aforementioned organic layer by using a sputtering device.

—Sealing and Production of Reflecting Layer—

A reflecting layer coated with silver or a diffusing reflector plate with a reflectance of at least 90% was applied to the back face (inside) of a sealing can, and the organic layer side of the substrate was sealed in a nitrogen gas atmosphere with a sealing glass canister coated with a sealing material on the face where the substrate is provided. This nitrogen gas (refractive index: 1) filled region served as a low refractive-index layer.

The face of the aforementioned organic layer parallel to the aforementioned substrate was square, and the distance between the reflecting layer or diffusing reflector plate and the aforementioned second transparent electrode (the thickness of the low refractive-index layer) was 0.01 to 0.5 times with respect to one side of this square.

<Measurement of Light Extraction Efficiency>

A DC constant current was applied to each of the organic electroluminescent elements to cause emission of light, and the external quantum efficiency was measured using a C9920-12 external quantum efficiency measurement apparatus made by Hamamatsu Photonics K.K. Then, the light extraction efficiency of the aforementioned organic electroluminescent elements was calculated from the following equation:

light extraction efficiency(times)=(external quantum efficiency of organic electroluminescent element÷external quantum efficiency of reference element)

Reference Example

Figure 6:
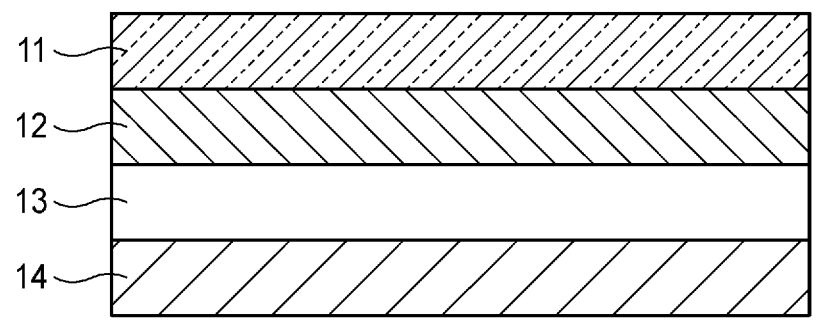
FIG. 6 is a schematic diagram illustrating the organic electroluminescent element in a reference example.

The organic electroluminescent element of the reference example (reference element) was produced by the same method as described above, except that ITO (100 nm) was provided by sputtering as a first transparent electrode (12) without forming a mask auxiliary wiring film over a glass substrate (11), a silver [film] (100 nm) was provided by vapor deposition as a second electrode (14), and no reflector was provided to the sealing can. With the light extraction efficiency of the reference element as 1, the light extraction efficiency was evaluated for the elements in the following working examples:

The layer structure of the reference element is shown in FIG. 6.

Working Examples 1 to 8

In the aforementioned method for producing an organic electroluminescent element, the thickness L1 (μm) of the diffusion conductive layer 1 (23), the particle content rate N1 (vol %), D/S, and the reflector (28) were respectively set as in the contents described in Table 1, and the organic electroluminescent elements of Working Examples 1 to 8 were produced. The results of measuring the light extraction efficiency are as shown in Table 1. Note that D/S in Table 1 and subsequent tables means the D/S found when D (μm) is the thickness of the low refractive-index layer, and S (μm²) is the surface area of the face closer to the reflector layer out of the faces where the organic layer is in contact with the layers adjacent to the organic layer.

Figure 7:
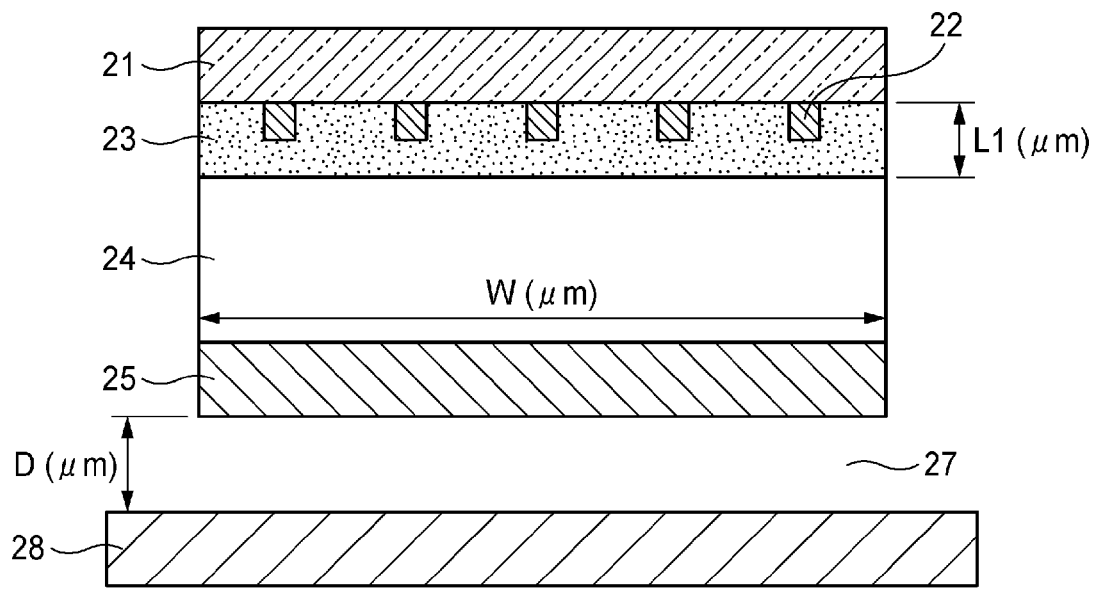
FIG. 7 is a schematic diagram illustrating the organic electroluminescent element in [each of] Working Examples 1 to 8 and Comparative Examples 8 and 9.

The layer structure of the organic electroluminescent elements in Working Examples 1 to 8 is shown in FIG. 7.

Working Examples 10 to 12

The organic electroluminescent elements of Working Examples 10 to 13 [sic][5] were produced by providing a diffusion electrode (26) as the second transparent electrode by the same method as that of the diffusion conductive layer 1, instead of the second transparent electrode (ITO) in the element configuration of Working Examples 1 to 8. Here, the thicknesses L1 and L2 (μm) of the diffusion conductive layers of the first transparent electrode (23) and the second transparent electrode, the particle content rates N1 and N2 (vol %), D/S, and the reflector (28) were respectively set as in the contents described in Table 2. The results of measuring the light extraction efficiency are as shown in Table 2.

[5] Translator's note: apparent error in the original; "Working Examples 10 to 13" should be "Working Examples 10 to 12."

Figure 8:
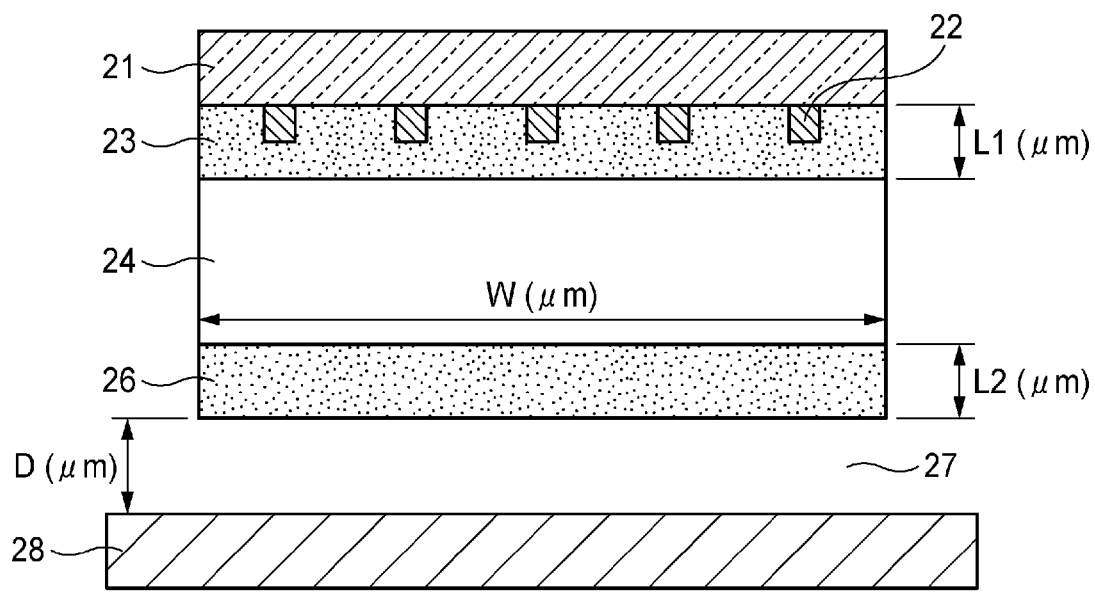
FIG. 8 is a schematic diagram illustrating the organic electroluminescent element in [each of] Working Examples 10 to 12.

The layer structure of the organic electroluminescent elements of Working Examples 10 to 12 is shown in FIG. 8.

Working Examples 14 and 15

Other than not providing an auxiliary electrode, the organic electroluminescent elements of Working Examples 14 and 15 were produced by the same method as in Working Examples 1 and 2. The results of measuring the light extraction efficiency are as shown in Table 3.

Figure 9:
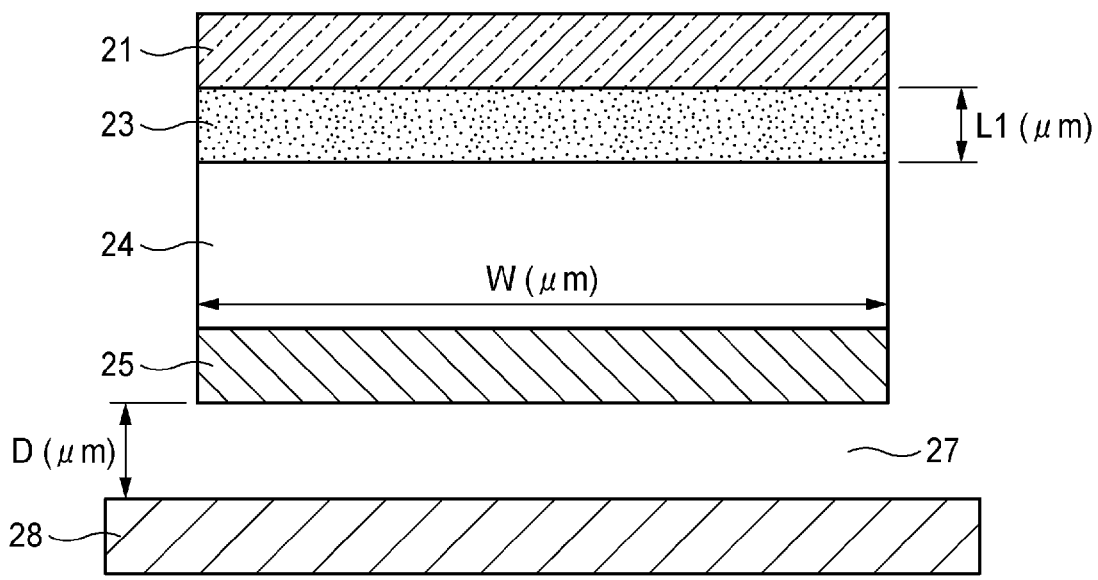
FIG. 9 is a schematic diagram illustrating the organic electroluminescent element in [each of] Working Examples 14 and 15.

The layer structure of the organic electroluminescent elements of Working Examples 14 and 15 are shown in FIG. 9.

Working Examples 17 to 19

The organic electroluminescent elements of Working Examples 17 to 19 were produced by providing a planarization layer (5 μm, the second layer of the first transparent electrode) of the first transparent electrode by using the diffusion conductive layer coating solution 2 between the organic layer and the first transparent electrode in the element configuration of Working Example 1, with the first transparent electrode (23c) being composed of two layers: a first layer (23a) and a second layer (23b). Here, the volumetric ratio of the PEDOT-PSS and titanium oxide in the diffusion conductive layer coating solution 2 and the refractive index of the second layer of the first transparent electrode were set as in the contents described in Table 4. The results of measuring the light extraction efficiency are as shown in Table 4.

Figure 10:
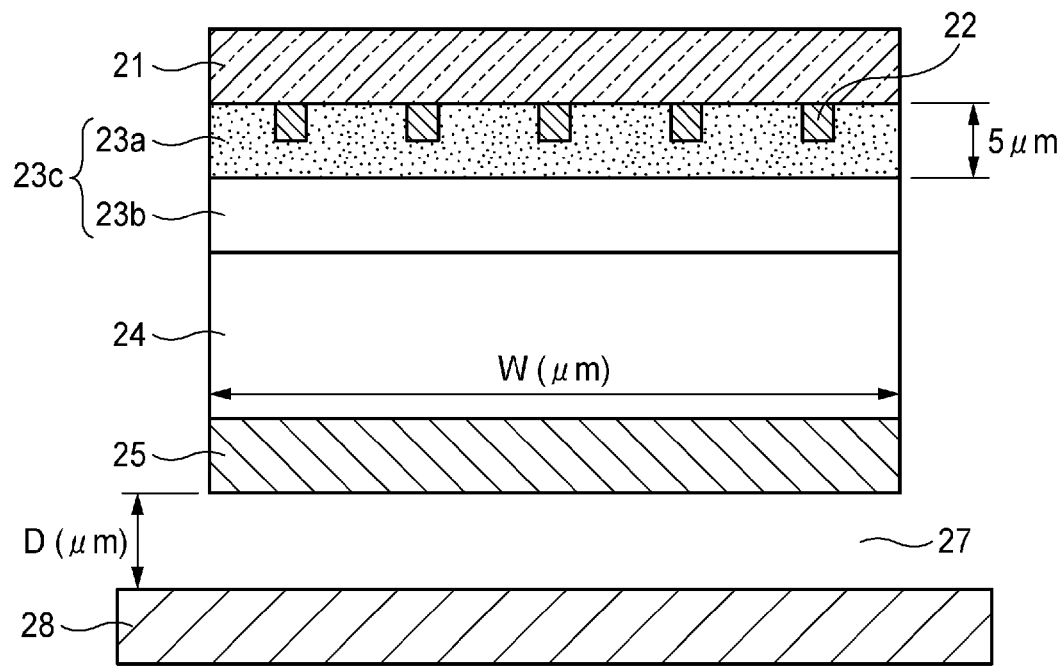
FIG. 10 is a schematic diagram illustrating the organic electroluminescent element in [each of] Working Examples 17 to 19.

The layer structure of the organic electroluminescent elements of Working Examples 17 to 19 is shown in FIG. 10.

Comparative Example 1

Other than providing ITO in a thickness of 100 nm as the first transparent electrode (29), the organic electroluminescent element of Comparative Example 1 was produced by the same method as in Working Example 1. The results of measuring the light extraction efficiency are as shown in Table 5.

Figure 11:
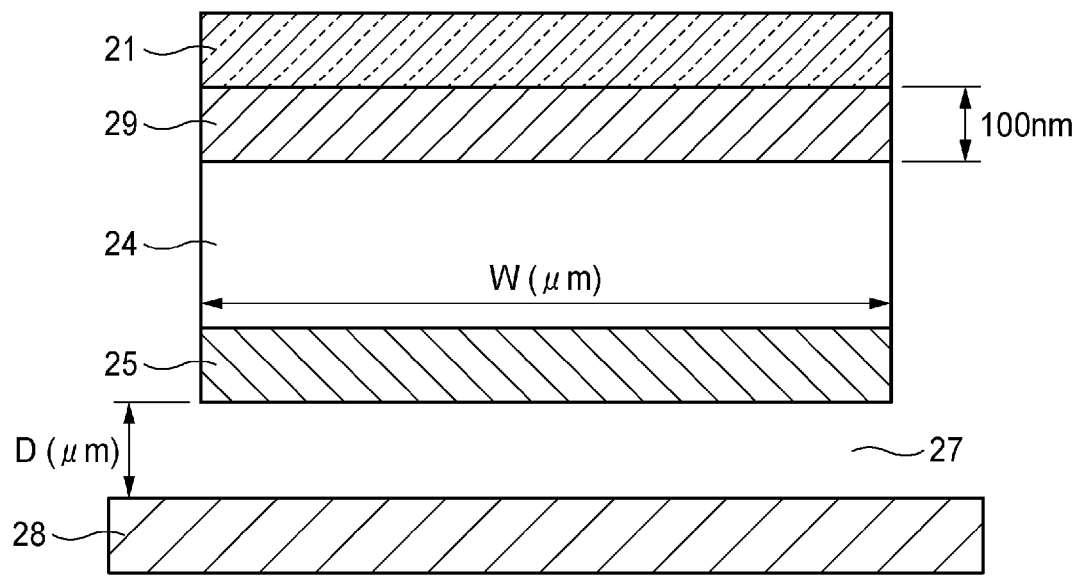
FIG. 11 is a schematic diagram illustrating the organic electroluminescent element in Comparative Example 1.

The layer structure of the organic electroluminescent element in Comparative Example 1 is shown in FIG. 11.

Comparative Examples 2 and 3

A diffusion conductive layer 1 (23) and an organic layer (24) were laminated over a glass substrate (21) by the same method as in Working Examples 1 to 8, and silver (100 nm) was provided by vapor deposition as a second electrode (30). Afterward, without providing a reflector, in a nitrogen gas atmosphere, the organic layer side of the substrate was sealed in a sealing glass canister coated with a sealing material on the face where the substrate is provided. Here, the thickness L1 (μm) and the particle content rate N1 (vol %) of the diffusion conductive layer of the first transparent electrode were respectively set as in the contents described in Table 6. The results of measuring the light extraction efficiency are as shown in Table 6.

Figure 12:
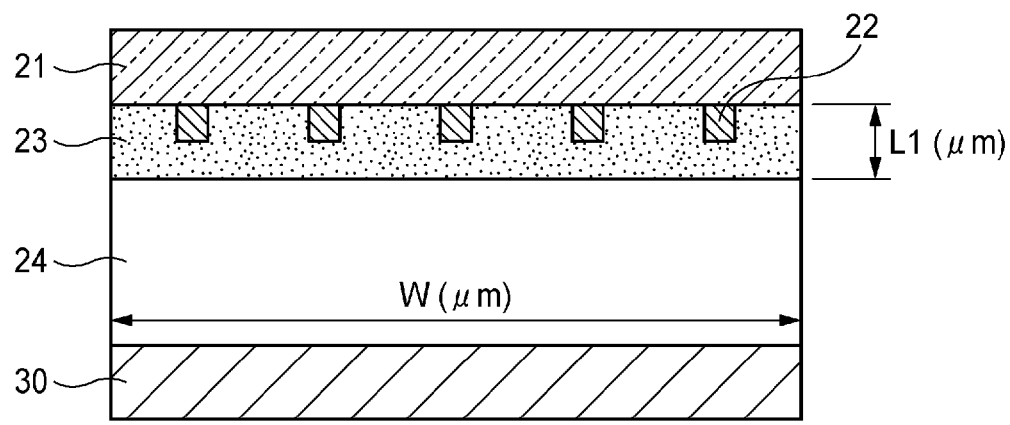
FIG. 12 is a schematic diagram illustrating the organic electroluminescent element in [each of] Comparative Examples 2 and 3.

The layer structure of the organic electroluminescent elements in Comparative Examples 2 and 3 is shown in FIG. 12.

Comparative Examples 4 to 6

Other than providing a light extraction layer (31) in the following step between the glass substrate (21) and the transparent electrode (29), organic electroluminescent elements were produced by the same method as in Comparative Example 1. Here, the thickness L1 (μm) and the particle content rate N1 (vol %) of the light extraction layer were respectively set as in the contents described in Table 7. The results of measuring the light extraction efficiency are as shown in Table 7.

Figure 13:
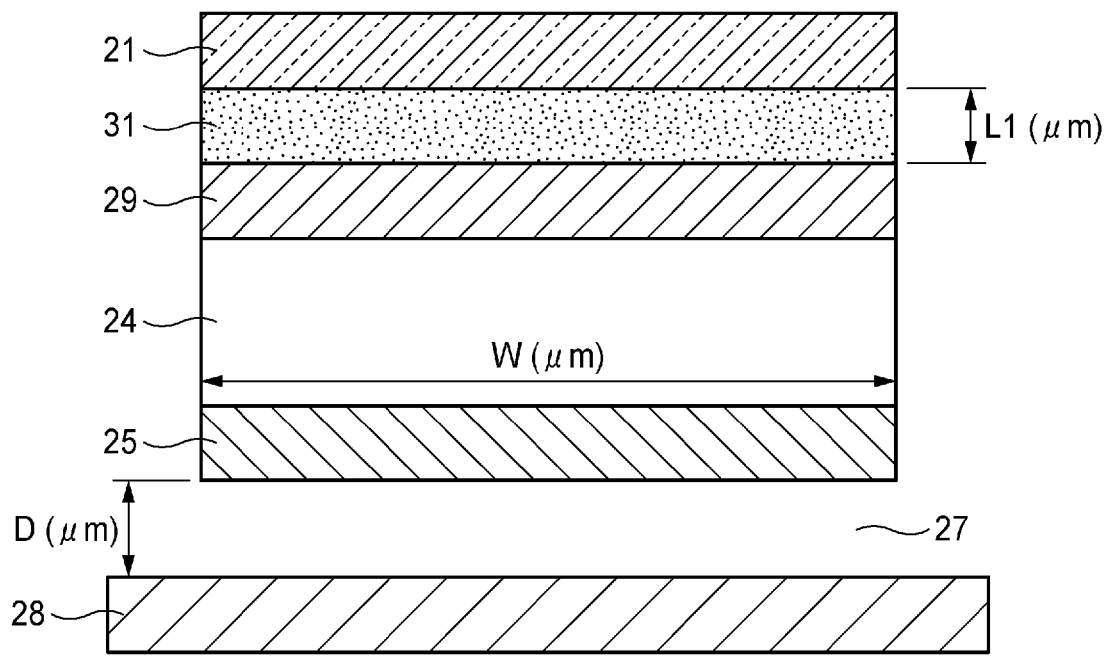
FIG. 13 is a schematic diagram illustrating the organic electroluminescent element in [each of] Comparative Examples 4 to 6.

The layer structure of the organic electroluminescent elements in Comparative Examples 4 to 6 is shown in FIG. 13.

Comparative Examples 8 and 9

Other than adding $TiO_2$ nanoparticles (15 nm) and ITO nanoparticles (40 nm) instead of the light-diffusing particles contained in the first transparent electrode (23), organic electroluminescent elements were produced by the same method as in Working Example 1. The results of measuring the light extraction efficiency are as shown in Table 8.

The layer structure of the organic electroluminescent elements in Comparative Examples 8 and 9 is shown in FIG. 7.

Comparative Example 10

Other than changing the low refractive-index layer in the element configuration of Working Example 1 from nitrogen (refractive index of 1) to $MgF_2$ (refractive index of 1.37), the organic electroluminescent element of Comparative Example 10 was produced by the same method. The result of measuring the light extraction efficiency was 2.10.

Figure 14:
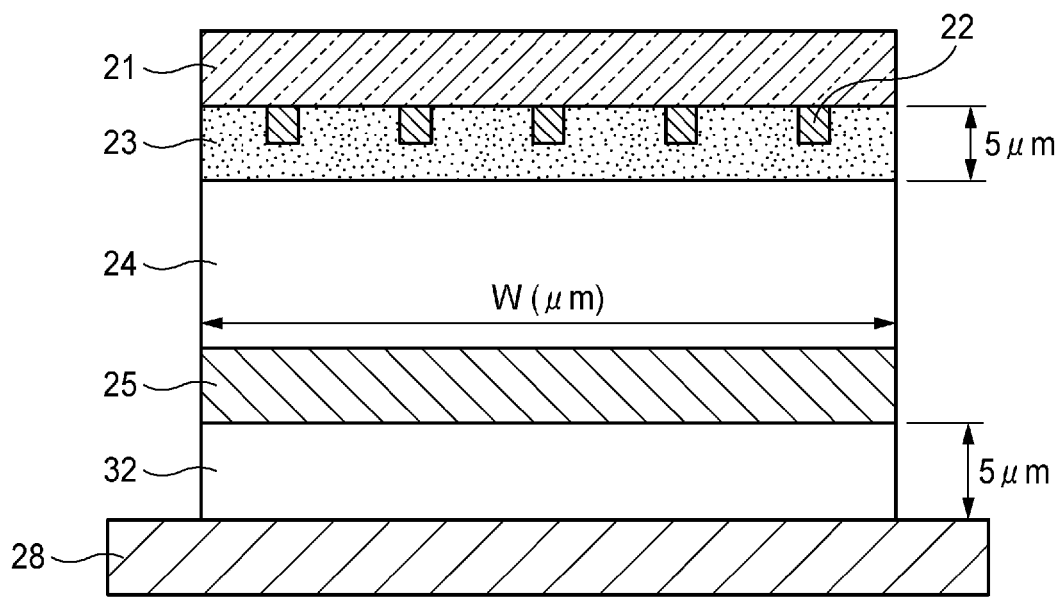
FIG. 14 is a schematic diagram illustrating the organic electroluminescent element in Comparative Example 10.

The layer structure of the organic electroluminescent element in Comparative Example 10 is shown in FIG. 14.

—Production of Light Extraction Layer Coating Solution—

11.2 g of resin material (Ogsol EA-0200, an acrylate compound made by Osaka Gas Chemicals Co., Ltd.) and 40 g of inorganic filler with a high refractive index (HTD-760, a $TiO_2$ dispersion made by Tayca Corporation) were mixed in 42 g of toluene and then dissolved by being stirred with a stirrer in a roller mixer. The $TiO_2$ was also dispersed ultrasonically (Sonifier) to obtain a resin with a high refractive index.

14.8 g of light-diffusing particles (EX-150, a material name of crosslinked acrylic particles with an average size of 1.5 μm and a refractive index of 1.49) were added under stirring with a stirrer to 93 g of the high refractive-index resin obtained [above], the light-diffusing particles were thoroughly dispersed ultrasonically in the high refractive-index resin, and [this product] was further stirred with a stirrer. Afterward, a polymerization initiator (Irgacure 819, made by Ciba) was added in an amount of 2 wt % with respect to the resin in an environment from which light with a wavelength of 450 nm or less had been cut out, and [this product] was thoroughly stirred to obtain a coating composition for forming a resin film which is such that the content rate of light-diffusing particles in the resin film was 30 vol %.

—Film Formation of Light Extraction Layer—

The aforementioned substrate was coated with the aforementioned light extraction layer coating solution using an edge coater, which formed a light extraction layer having a film thickness L1 of 2 to 10 μm.

It was found from the results of Working Examples 1 to 13 [sic][6] that the organic electroluminescent elements of the present invention had extremely high light extraction efficiency compared to the light extraction efficiency of the reference element.

[6] Translator's note: The phrase "Working Examples 1 to 19" or simply "the working examples" was probably intended in the original instead of "Working Examples 1 to 13."

Moreover, it was found that it is preferable for the film thickness L1 (μm) of the diffusion scattering film and the content rate N1 (vol %) of the light-diffusing particles to satisfy L1×N1≥200 because the light extraction efficiency will be further increased. In addition, it was found that satisfying [the relationship] D/S≥0.04 is also preferable because the light extraction efficiency will be further enhanced. These results coincide well with the results of the aforementioned simulation.

It was found from the results of Comparative Example 1 that the light extraction efficiency of an organic electroluminescent element in which the transparent electrode adjacent to the glass substrate has a low refractive-index layer but does not contain any transparent particles whose primary particle size is 0.5 μm or more is far lower than the light extraction efficiency of the elements in the working examples.

It was found from the results of Comparative Examples 2 and 3 that the light extraction efficiency of an organic electroluminescent element in which the transparent electrode adjacent to the glass substrate contains transparent particles whose primary particle size is 0.5 μm or more but does not have a low refractive-index layer is lower than the light extraction efficiency of the elements in the working examples.

It was found from the results of Comparative Examples 4 to 7 [sic][7] that although the light extraction efficiency is improved over the light extraction efficiency in Comparative Example 1 when a light extraction layer containing transparent particles whose primary particle size is 0.5 μm or more is provided separately in the organic electroluminescent element of Comparative Example 1, it was still lower than the light extraction efficiency in the working examples.

[7] Translator's note: apparent error in the original; "Comparative Examples 4 to 7" should be "Comparative Examples 4 to 6."

It was found from the results of Comparative Examples 8 and 9 that the light extraction efficiency of an organic electroluminescent element having a first transparent electrode that does not contain particles whose primary particle size is 0.5 μm or more as light-diffusing particles is lower than the light extraction efficiency of the elements in the working examples.

It was found from the results of Comparative Example 10 that the light extraction efficiency of an organic electroluminescent element having a low refractive-index layer whose refractive index exceeds 1.3 is lower than the light extraction efficiency of the elements in the working examples.

TABLE 1

| | Electrode film thickness L1 (μm) | Particle content rate N1 (vol %) | L1 × N1 | D/S | Reflector | Light extraction efficiency |
|---|---|---|---|---|---|---|
| Working Example 1 | 5 | 50 | 250 | 0.25 | Ag | 2.50 |
| Working Example 2 | 10 | 50 | 500 | 0.25 | Ag | 2.52 |
| Working Example 3 | 2 | 50 | 100 | 0.25 | Ag | 2.36 |
| Working Example 4 | 5 | 50 | 250 | 0.0001 | Ag | 2.29 |
| Working Example 5 | 5 | 50 | 250 | 0.04 | Ag | 2.4 |
| Working Example 6 | 5 | 50 | 250 | 0.01 | Ag | 2.33 |
| Working Example 7 | 25 | 10 | 250 | 0.25 | Ag | 2.50 |
| Working Example 8 | 10 | 10 | 100 | 0.25 | Ag | 2.35 |

TABLE 2

| | First transparent electrode | | | Second transparent electrode | | | | | |
|---|---|---|---|---|---|---|---|---|---|
| | Electrode film thickness L1 (μm) | Particle content rate N1 (vol %) | L1 × N1 | Electrode film thickness L2 (μm) | Particle content rate N2 (vol %) | L2 × N2 | D/S | Reflector | Light extraction efficiency |
| Working Ex. 10 | 5 | 50 | 250 | 5 | 50 | 250 | 0.25 | Ag | 2.52 |
| Working Ex. 11 | 5 | 50 | 250 | 10 | 50 | 500 | 0.25 | Ag | 2.52 |
| Working Ex. 12 | 5 | 50 | 250 | 2 | 50 | 100 | 0.25 | Ag | 2.49 |

TABLE 3

| | Electrode film thickness L1 (μm) | Particle Content rate N1 (vol %) | T1 × N1 | D/S | Reflector | Light extraction efficiency |
|---|---|---|---|---|---|---|
| Working Example 14 | 5 | 50 | 250 | 0.25 | Ag | 2.50 |
| Working Example 15 | 10 | 50 | 500 | 0.25 | Ag | 2.52 |

TABLE 4

| | Diffusion conductive layer coating solution 2 PEDOT-PSS:Titanium oxide volumetric ratio | Refractive index of second layer of first transparent electrode | Light extraction efficiency |
|---|---|---|---|
| Working Example 17 | 9:1 | 1.57 | 2.15 |
| Working Example 18 | 6:3 | 1.77 | 2.50 |
| Working Example 19 | 5:5 | 1.90 | 2.20 |

TABLE 5

| | D/S | Reflector | Light extraction efficiency |
|---|---|---|---|
| Comparative Example 1 | 0.25 | Ag | 1.1 |

TABLE 6

| | Electrode film thickness L1 (μm) | Particle content rate N1 (vol %) | L1 × N1 | Light extraction efficiency |
|---|---|---|---|---|
| Comparative Example 2 | 5 | 50 | 250 | 2.1 |
| Comparative Example 3 | 2 | 50 | 100 | 2 |

TABLE 7

| | Light extraction layer thickness L1 (μm) | Particle content rate N1 (vol %) | L1 × N1 | D/S | Reflector | Light extraction efficiency |
|---|---|---|---|---|---|---|
| Comparative Example 4 | 5 | 50 | 250 | 0.25 | Ag | 2.05 |
| Comparative Example 5 | 10 | 50 | 500 | 0.25 | Ag | 2.10 |
| Comparative Example 6 | 2 | 50 | 100 | 0.25 | Ag | 2.0 |

TABLE 8

| | Particles in first transparent electrode | Primary particle size | Light extraction efficiency |
|---|---|---|---|
| Comparative Example 8 | $TiO_2$ | 15 nm | 1.4 |
| Comparative Example 9 | ITO | 40 nm | 1.6 |

DESCRIPTION OF SYMBOLS

1 transparent substrate
2, 4 coating-type conductive layer
3 organic layer
3a light-emitting region
5, 27 low refractive-index layer
6 reflector (silver)
11, 21 glass substrate
12, 29 transparent electrode (no light-diffusing particles)
13, 24 organic layer
14, 30 silver electrode
22 auxiliary wiring
23 first transparent electrode (diffusion conductive layer)
23a first layer (diffusion conductive layer)
23b second layer (planarization layer)
23c first transparent electrode (first layer+second layer)
25 second transparent electrode
26 second transparent electrode (diffusion conductive layer)
28 reflector (silver), diffusing plate
31 light extraction layer
32 $MgF_2$ layer

The invention claimed is:

1. An organic electroluminescent element, comprising, in this order: a substrate, a first transparent electrode that is in direct contact with the substrate, an organic layer including at least one organic light-emitting layer, a second transparent electrode, a low refractive-index layer with a refractive index of 1.3 or less, and a reflector layer, wherein said first transparent electrode contains at least one type of transparent particle with a primary particle size of 0.5 μm or more,
   wherein said first transparent electrode is composed of two layers: a first layer containing at least one type of transparent particle with a primary particle size of 0.5 μm or more and a second layer that does not contain transparent particles with a primary particle size of 0.5 μm or more but does contain particles with a primary particle size of 100 nm or less, and wherein the absolute value of the difference between the refractive index of the constituent components of the second layer and the refractive index of the constituent components of the first layer, not including the at least one type of transparent particle with a primary particle size of 0.5 μm or more, is 0.02 or less.

2. The organic electroluminescent element according to claim 1, wherein the content rate N1 (vol %) of transparent particles with a primary particle size of 0.5 μm or more contained in said first transparent electrode and the film thickness L1 (μm) of said first transparent electrode satisfy the relationship L1×N1>200.

3. The organic electroluminescent element according to claim 1, wherein said organic layer has a face in contact with the second transparent electrode, and when the surface area of the face is designated as S ($\lambda m^2$), and the thickness of said low refractive-index layer is designated as D (μm), then the relationship: D/S >0.04 is satisfied.

4. The organic electroluminescent element according to claim 1, wherein at least either said first transparent electrode or said second transparent electrode contains a conductive matrix.

5. The organic electroluminescent element according to claim 1, wherein said first transparent electrode further contains particles having a primary particle size of 100 nm or less.

6. The organic electroluminescent element according to claim 1, wherein said first transparent electrode contains a conductive matrix and particles having a primary particle size of 100 nm or less, and the refractive index of these particles is higher than the refractive index of said conductive matrix.

7. The organic electroluminescent element according to claim 1, wherein said reflector layer is made up of a metal or is made up of a diffusing reflector plate with a reflectance of at least 90%.

* * * * *